United States Patent
Giusti et al.

(10) Patent No.: US 10,150,131 B2
(45) Date of Patent: Dec. 11, 2018

(54) DUAL APPLICATOR FLUID DISPENSING METHODS AND SYSTEMS

(71) Applicant: NORDSON CORPORATION, Westlake, OH (US)

(72) Inventors: Christopher L. Giusti, San Marcos, CA (US); Philip P. Maiorca, Poway, CA (US); Mark S. Meier, Encinitas, CA (US); David N. Padgett, Carlsbad, CA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 15/624,932

(22) Filed: Jun. 16, 2017

(65) Prior Publication Data

US 2017/0282207 A1    Oct. 5, 2017

Related U.S. Application Data

(62) Division of application No. 14/326,722, filed on Jul. 9, 2014, now Pat. No. 9,707,584.

(51) Int. Cl.
*B05C 11/10* (2006.01)
*B05B 13/04* (2006.01)
(Continued)

(52) U.S. Cl.
CPC .............. *B05B 12/124* (2013.01); *B05B 3/00* (2013.01); *B05B 13/0442* (2013.01);
(Continued)

(58) Field of Classification Search
None
See application file for complete search history.

(56) References Cited

U.S. PATENT DOCUMENTS 5,830,297 A    11/1998  Nakahira et al.
5,873,939 A     2/1999  Doyle et al.
(Continued)

FOREIGN PATENT DOCUMENTS

GB    2377908 A    1/2003
JP    05-090799 A  4/1993
(Continued)

OTHER PUBLICATIONS

Speedline Technologies, Camalot Dual Head Synchronous Dispense Mode, Non-Contact Dispense Pump, Brochure, 2010, 2 pgs.
(Continued)

*Primary Examiner* — Jethro M. Pence
(74) *Attorney, Agent, or Firm* — Baker & Hostetler LLP

(57) ABSTRACT

Methods for simultaneously dispensing a first fluid pattern at a first dispense region with a first applicator and a second fluid pattern at a second dispense region with a second applicator. The first and second applicators are moved toward their respective dispense regions with a positioner. While dispensing, the second applicator is moved relative to the first applicator in a direction or directions parallel to a first axis, a second axis, and/or a third axis, the axes being mutually orthogonal. The first dispense region may be provided with a unique first tilt and/or a unique first contour relative to the reference plane and along the third axis. Systems for dispensing fluid include a primary positioner supporting a first applicator, and a secondary positioner coupled to the primary positioner and supporting a second applicator and configured to move the second applicator relative to the first applicator.

18 Claims, 14 Drawing Sheets

(51) Int. Cl.
  *B05C 5/02* (2006.01)
  *B05B 12/12* (2006.01)
  *B05B 3/00* (2006.01)
  *B05D 1/02* (2006.01)
  *B05C 13/02* (2006.01)
  *H01L 21/673* (2006.01)

(52) U.S. Cl.
  CPC ............ *B05C 5/027* (2013.01); *B05C 5/0216* (2013.01); *B05C 11/1018* (2013.01); *B05C 11/1021* (2013.01); *B05D 1/02* (2013.01); *B05C 13/02* (2013.01); *H01L 21/67333* (2013.01)

(56) References Cited

U.S. PATENT DOCUMENTS

| | | | |
|---|---|---|---|
| 5,886,494 | A | 3/1999 | Prentice et al. |
| 6,007,631 | A | 12/1999 | Prentice et al. |
| 6,206,964 | B1 | 3/2001 | Purcell et al. |
| 6,224,675 | B1 | 5/2001 | Prentice et al. |
| 6,322,854 | B1 | 11/2001 | Purcell et al. |
| 6,866,881 | B2 | 3/2005 | Prescott et al. |
| 6,991,825 | B2 | 1/2006 | Hui et al. |
| 7,407,553 | B2 | 8/2008 | Jung et al. |
| 7,833,572 | B2 | 11/2010 | Read |
| 7,908,997 | B2 | 3/2011 | Lessley et al. |
| 7,923,056 | B2 | 4/2011 | Read |
| 7,923,572 | B2 | 4/2011 | Taniguchi et al. |
| 7,950,344 | B2 | 5/2011 | Kawase |
| 8,230,783 | B2 | 7/2012 | Klauser et al. |
| 8,230,805 | B2 | 7/2012 | Read |
| 8,388,204 | B2 | 3/2013 | Case et al. |
| 8,580,335 | B2 | 11/2013 | Shinohara |
| 2002/0078580 | A1 | 6/2002 | Haugen et al. |
| 2003/0045967 | A1 | 3/2003 | Milojevic et al. |
| 2003/0081077 | A1 | 5/2003 | Nakamura et al. |
| 2003/0085943 | A1 | 5/2003 | Nakamura et al. |
| 2004/0036726 | A1 | 2/2004 | Zach |
| 2004/0148763 | A1 | 8/2004 | Peacock et al. |
| 2005/0056215 | A1 | 3/2005 | Shimoda |
| 2006/0169202 | A1* | 8/2006 | Erickson .................. B05B 7/02 118/323 |
| 2008/0156207 | A1 | 7/2008 | Ellenbogen |
| 2009/0236366 | A1 | 9/2009 | Ikushima |
| 2011/0107963 | A1 | 5/2011 | Park et al. |
| 2012/0190136 | A1 | 7/2012 | Hong |
| 2013/0206063 | A1 | 8/2013 | Van et al. |
| 2015/0093498 | A1* | 4/2015 | Reid .................. H05K 3/0085 427/97.3 |
| 2016/0270235 | A1 | 9/2016 | Reid et al. |

FOREIGN PATENT DOCUMENTS

| | | |
|---|---|---|
| JP | 2003-246072 A | 9/2003 |
| JP | 2009-066583 A | 4/2009 |
| JP | 2009-072648 A | 4/2009 |
| KR | 10-0830668 B1 | 5/2008 |
| KR | 2010-0003934 A | 1/2010 |
| KR | 2010-0025290 A | 3/2010 |
| KR | 2010-0052816 A | 5/2010 |
| WO | 00/38494 A2 | 6/2000 |

OTHER PUBLICATIONS

Nordson Asymtek, Dual Applicator Bracket for Select Coat SL-941E Conformal Coating Platforms, Brochure, 2010, 4 pgs.
Asymtek, DB-02 & DB-03 Valve Brackets, Brochure, 1994, 1 pg.

* cited by examiner

DUAL APPLICATOR FLUID DISPENSING METHODS AND SYSTEMS

CROSS REFERENCE TO RELATED APPLICATIONS

This application is a divisional of U.S. patent application Ser. No. 14/326,722, filed Jul. 9, 2014, and published as U.S. Patent App. Pub. No. 2016/0008835 on Jan. 14, 2016, which is hereby incorporated by reference herein.

TECHNICAL FIELD

The present invention relates generally to dispensing viscous fluids, and more particularly to dispensing viscous fluids at multiple dispense regions simultaneously with multiple fluid applicators.

BACKGROUND

In the manufacture of electronic substrates, such as printed circuit boards ("PCB") for example, it is frequently necessary to apply small, precise amounts of viscous fluids, i.e., those with a viscosity greater than 50 centipoise. Such fluids may include adhesives, solder paste, solder flux, solder mask, underfill material, encapsulants, potting compounds, epoxies, die attach pastes, silicones, RTV, or cyanoacrylates, for example.

Automated fluid dispensing systems are often used for dispensing patterns of such viscous fluids onto substrates with a high degree of accuracy, repeatability, and efficiency. As used herein, the term "fluid pattern," and variations thereof, refers to one or more lines, arcs, dots, combinations thereof, and/or any other configuration of continuously or intermittently dispensed fluid. Traditional fluid dispensing systems include a fluid applicator, also referred to as a dispenser or valve, mounted to a gantry which is movable for positioning the applicator as desired along three mutually orthogonal axes (X, Y, Z) above one or more substrates positioned generally in the horizontal XY plane. The gantry is generally movable with drive mechanisms controlled by a computer system or other controller. A moving conveyor, generally aligned with the X axis of the dispensing system, may be used to sequentially deliver pluralities of substrates to a location generally beneath a fluid dispensing system. The pluralities of substrates are often organized into and carried by carrier trays, such as a JEDEC tray. The dispensing system may then be operated to dispense a pre-programmed pattern of fluid onto the substrates.

To dispense a pattern of fluid onto one or more substrates held in a carrier tray, the controller first determines the location and orientation of the substrates in the horizontally-oriented XY plane in which the substrates generally lie. A camera mounted to the gantry scans the substrates and captures visual images of reference fiducials provided on the top surfaces of each substrate by traveling along a path that moves across the pre-programmed locations of the reference fiducials which are known by the controller. Based on these captured visual images, the controller determines the actual location and orientation of each substrate in the XY plane. A height sensor, also mounted to the gantry, measures the position of each substrate along the vertically-oriented Z axis for determining a proper dispense height at which a dispensing tip of the applicator should be positioned when dispensing onto the substrate. The controller then operates the gantry to move the applicator along the X and Y axes until the applicator is properly positioned in the XY plane over a desired region of a substrate positioned below. The applicator is then lowered along the Z axis until the dispensing tip is at the proper dispensing height, at which point the applicator then dispenses the pre-programmed fluid pattern onto the substrate. Upon completion of dispensing, the applicator is then raised back up along the Z axis and may be repositioned in the XY plane for subsequent dispensing at a new region of the same substrate or of a new substrate.

For increased manufacturing throughput, fluid dispensing systems have been provided with dual fluid applicators for simultaneously dispensing at first and second dispense regions. As used herein, the term "dispense region" refers to a general region or zone at which a fluid pattern is dispensed. For example, "dispense region" may refer to a substrate generally or it may refer to a particular region of a substrate. Accordingly, the phrase "first and second dispense regions," and variations thereof, may refer to first and second substrates that are physically independent of each other, or alternatively it may refer to first and second distinct regions of a single substrate. For example, a single substrate, such as a panelized substrate, may include a plurality of distinct regions at which fluid is dispensed.

With traditional fluid dispensing systems, a first applicator is positioned and controlled to dispense at a first dispense region, such as a first substrate, while a second applicator is simultaneously positioned and controlled to dispense at a second dispense region, such as a second substrate. On occasion, the first and second substrates may be rotated in the same way in the XY plane of the dispensing system (i.e., "globally rotated") relative to the X and Y axes. Global rotation of the substrates may occur when the carrier tray in which the substrates are carried is not aligned with the X and Y axes. Traditional dual dispensing methods have included steps for making an automated, one-time positional adjustment of the second applicator relative to the first applicator along the X and Y axes prior to dispensing to thereby enable simultaneous dispensing of identical fluid patterns onto globally rotated first and second substrates.

However, traditional dual dispensing methods have not included automatically repositioning the first and second applicators relative to each other along the X or Y axes while actively dispensing. In other words, traditional dual dispensing systems do not perform active, real-time positional adjustments of the first and second applicators relative to each other in the XY plane while dispensing. Consequently, traditional dual dispensing methods have not accomplished accurate simultaneous dispensing of identical fluid patterns at first and second dispense regions, such as first and second substrates, that are rotated relative to each other in the XY plane (i.e., "locally rotated"). For example, a first rectangular substrate may be aligned parallel with the X and Y axes and a second rectangular substrate may be rotated in the XY plane relative to the X and Y axes. Such local rotation may occur when a substrate is sized smaller than the carrier tray pocket in which it sits, thereby forming one or more gaps between the outer perimeter of the substrate and the inner wall of the pocket. The substrate is thus permitted to rotate within the pocket in the XY plane, and relative to any one or more adjacent substrates. Additionally, local rotation may be present among multiple dispense regions of a single substrate, for example a panelized circuit board. Traditional dual dispensing methods are deficient in actively correcting for such local rotation while dispensing.

Furthermore, traditional dual dispensing methods have not included actively repositioning the first or second applicator relative to each other along the vertical Z axis of the dispensing system while the first and second applicators are dispensing. Accordingly, traditional dual dispensing systems have not accomplished accurate dual dispensing at first and second dispense regions, such as first and second substrates, where the first and second dispense regions are tilted in the XY plane relative to each other, or where one of the dispense regions is uniquely contoured relative to the XY plane, along the Z axis. Thus, dispense regions that are "rotated" relative to each other may lay in a common XY reference plane. In contrast, dispense regions that are "tilted" and/or "contoured" relative to each other do not lie in a common plane, and the dispense regions are uniquely tilted and/or uniquely contoured relative to the XY reference plane, as described in greater detail below in connection with embodiments of the invention (see e.g., FIG. 13A).

In illustration of the discussion above, FIG. 1 shows a carrier tray 10 having a plurality of adjacent pockets 12a, 12b, 12c, and 12d for receiving a corresponding plurality of substrates 14a, 14b, 14c, and 14d. As shown, each substrate 14a-14d may include a corresponding component 16a, 16b, 16c, and 16d mounted thereto. Each pocket 12a-12d has a depth in a direction perpendicular to the XY plane, and is sized and shaped to retain the corresponding substrate 14a-14d in a centered position and in proper orientation relative to a global origin O. FIG. 2 shows a carrier tray 20 in which pockets 22a, 22b, 22c, and 22d are sized slightly larger than their corresponding substrates 24a, 24b, 24c, and 24d held therein, such that gaps are created between the outer perimeter of each substrate A-D and the inner walls of its corresponding pocket 22a-22d. Accordingly, each substrate 24a-24d is permitted to shift and thereby become rotated and/or translated in the XY plane relative to its centered orientation (shown in phantom) and relative to each of the other substrates 24a-24d.

FIG. 3 shows the carrier tray 20 and substrates 24a-24d of FIG. 2, but where substrate 24b is tilted relative to the XY plane. More specifically, FIG. 3A shows an angular offset between a bottom surface 26 of substrate 24b and a base surface 28 of its pocket 22b, thereby forming a wedge-shaped gap 25. Such tilting may be caused by the presence of a foreign material between the bottom surface 26 and the base surface 28. Alternatively, tilting of a substrate may occur if the substrate is malformed, for example through warping. As discussed above, traditional dual dispensing methods have not accomplished automated, real-time adjustment of applicator positioning while dispensing so as to accurately dispense at first and second dispense regions, such as first and second substrates, that are misaligned in the manners shown in FIGS. 2-3A. Accordingly, there is a need for dual dispensing methods and systems that address such deficiencies.

SUMMARY

An exemplary method is provided for dispensing a first fluid pattern at a first dispense region and a second fluid pattern at a second dispense region. The first and second dispense regions may be first and second independent substrates, as primarily shown and described herein, or they may be separate regions of a common substrate, for example. The first and second dispense regions are positioned relative to a reference plane defined by a first axis and a second axis orthogonal to the first axis. Positions of the first and second dispense regions in the reference plane are determined. Positions of the first dispense region and the second dispense region along a third axis are determined, the third axis being mutually orthogonal with the first and second axes. A first applicator is moved toward the first dispense region with a positioner and the second applicator is moved toward the second dispense region with the positioner. The first fluid pattern is dispensed at the first dispense region with the first applicator and the second fluid pattern is simultaneously dispensed at the second dispense region with the second applicator. The second applicator is moved relative to the first applicator in at least one of a direction parallel to the first axis, a direction parallel to the second axis, or a direction parallel to the third axis while the first applicator dispenses at the first dispense region and the second applicator simultaneously dispenses at the second dispense region.

Another exemplary method is provided for dispensing a first fluid pattern at a first dispense region and a second fluid pattern at a second dispense region. The first and second dispense regions are positioned relative to a reference plane defined by a first axis and a second axis orthogonal to the first axis. The first dispense region is provided with at least one of a first tilt or a first contour relative to the reference plane and along a third axis mutually orthogonal with the first axis and the second axis. The at least one of the first tilt or the first contour is unique to the first dispense region. The method includes determining a first dispense height path corresponding to the at least one of the first tilt or the first contour of the first dispense region. The first dispense height path is unique to the first dispense region. The method further includes moving the first applicator along the first dispense height path to dispense the first fluid pattern at the first dispense region. Simultaneously, the second applicator is moved relative to the second dispense region to dispense the second fluid pattern at the second dispense region.

Another exemplary method is provided for positioning a first applicator for dispensing fluid at a first dispense region and positioning a second applicator for dispensing fluid at a second dispense region. The first dispense region and the second dispense region are positioned relative to a reference plane defined by a first axis and a second axis orthogonal to the first axis. Positions of the first and second dispense regions in the reference plane are determined. Positions of the first dispense region and the second dispense region along a third axis are determined, the third axis being mutually orthogonal with the first and second axes. A primary positioner is controlled to move the first applicator and the second applicator in at least one of a direction parallel to the first axis or a direction parallel to the second axis to position the first applicator relative to the first dispense region. Simultaneously, a secondary positioner coupled to the primary positioner is controlled to move the second applicator relative to the first applicator in at least one of a direction parallel to the first axis or a direction parallel to the second axis to position the second applicator relative to the second dispense region.

An exemplary dispensing system is provided for dispensing fluid at a first dispense region and a second dispense region. The first and second dispense regions are each positioned relative to a reference plane defined by a first axis and a second axis orthogonal to the first axis. The system includes a first applicator for dispensing fluid at the first dispense region, and a second applicator for dispensing fluid at the second dispense region. A primary positioner is configured to position the first applicator for dispensing fluid at the first dispense region. The primary positioner supports the first applicator and has a first drive to move the first applicator in a direction parallel to the first axis, a second drive to move the first applicator in a direction parallel to the second axis, and a third drive to move the first applicator in a direction parallel to a third axis. The third axis is mutually orthogonal with the first and second axes. A secondary positioner is coupled to the primary positioner and is configured to position the second applicator for dispensing fluid at the second dispense region. The secondary positioner supports the second applicator and has a first drive to move the second applicator relative to the first applicator in a direction parallel to the first axis, a second drive to move the second applicator relative to the first applicator in a direction parallel to the second axis, and a third drive to move the second applicator relative to the first applicator in a direction parallel to the third axis. The first drives, the second drives, and the third drives associated with the primary positioner and the secondary positioner are controlled by a system controller.

Various additional features and advantages of the invention will become more apparent to those of ordinary skill in the art upon review of the following detailed description of the illustrative embodiments taken in conjunction with the accompanying drawings.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION

Figure 4:
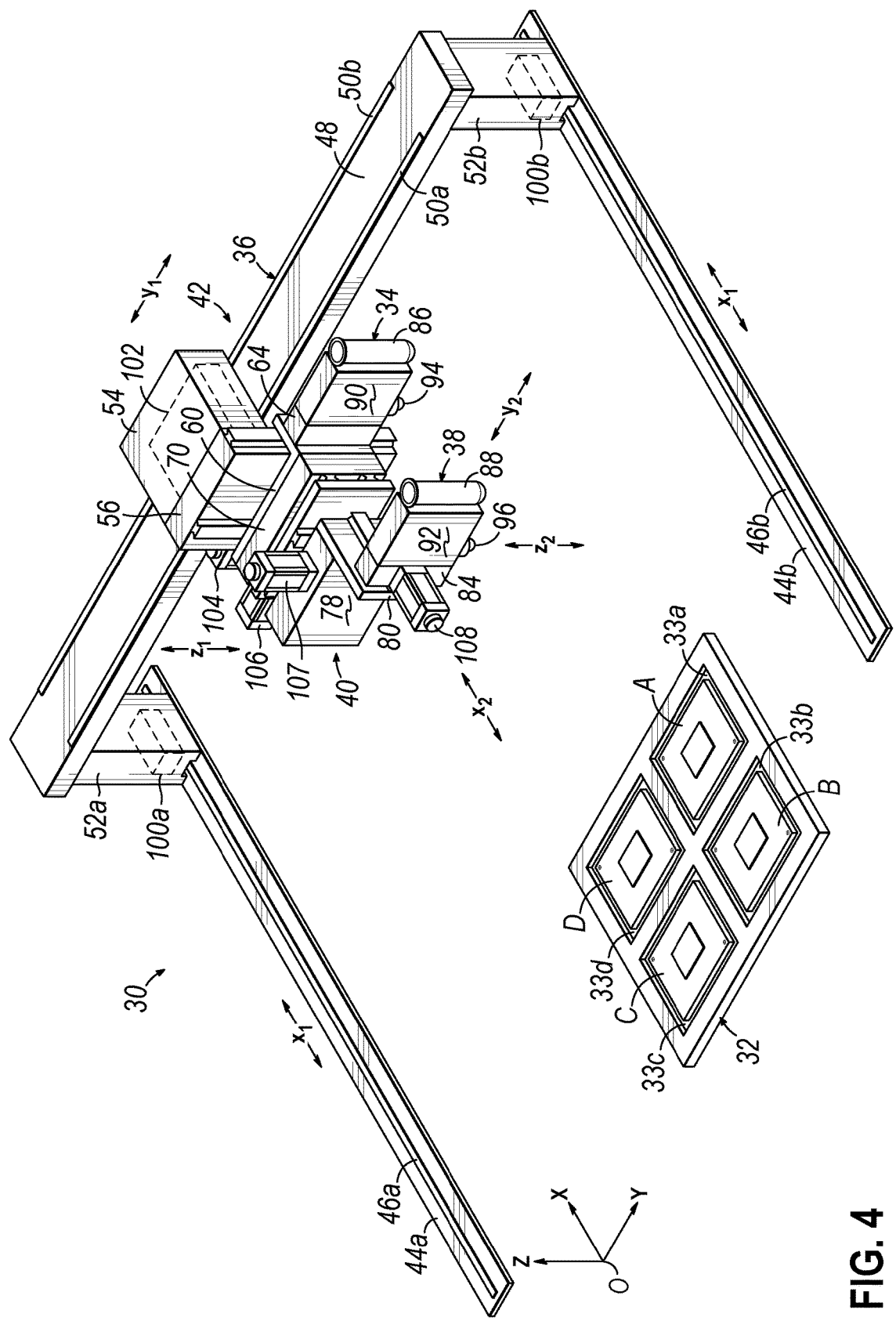
FIG. 4 is an isometric schematic view of a dual applicator dispensing system according to an embodiment of the invention.
Figure 5:
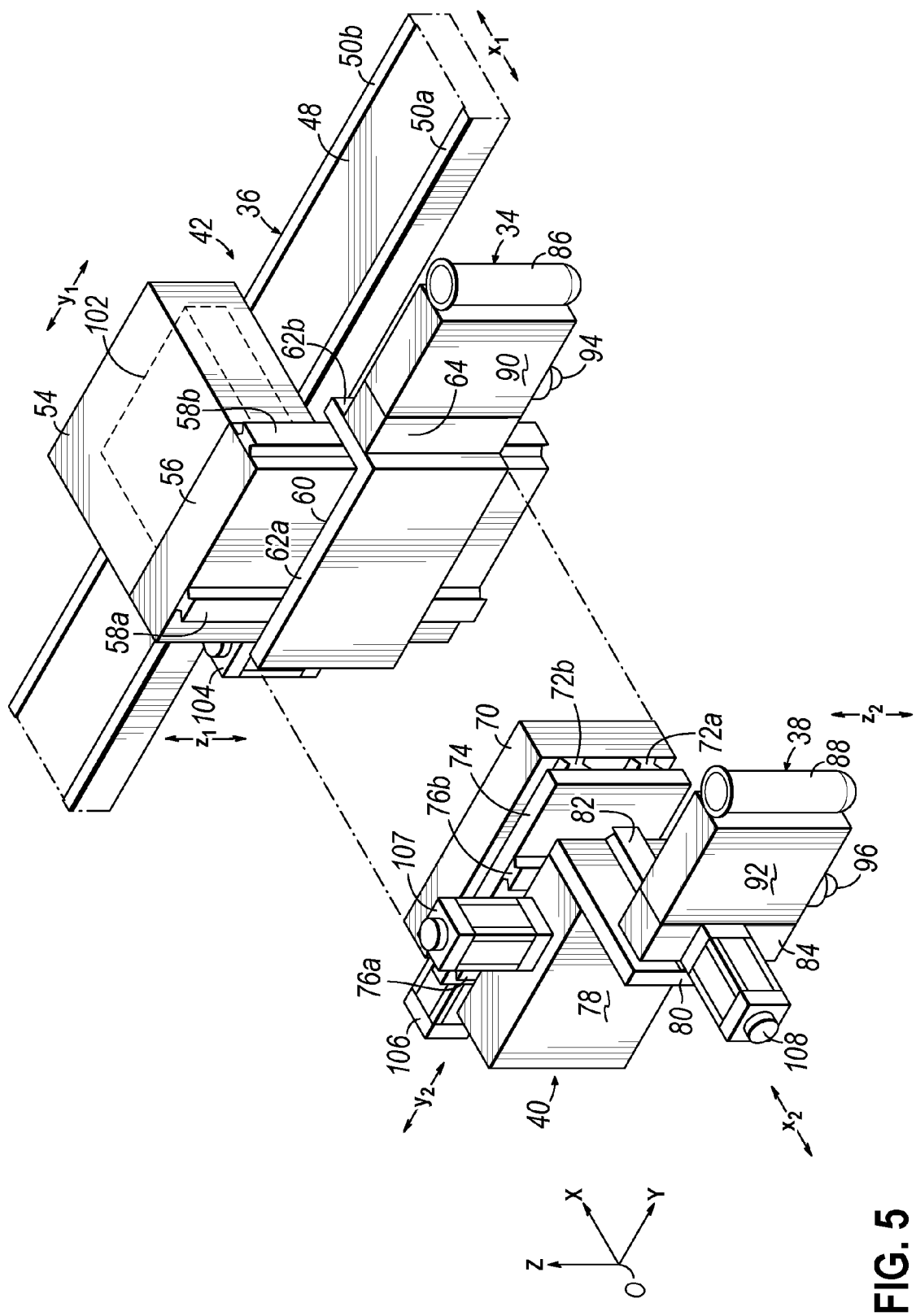
FIG. 5 is an isometric schematic view similar to FIG. 3, showing a secondary positioner disassembled from a primary positioner.

Turning to FIGS. 4 and 5, an exemplary dual applicator fluid dispensing system 30 for dispensing viscous fluids at a plurality of dispense regions, such as independent substrates A, B, C, D held in a carrier tray 32, is shown schematically. While only four substrates A-D are shown herein, arranged in a rectangular configuration in corresponding pockets 33a, 33b, 33c, 33d, the carrier tray 32 may be adapted to carry any desired number of substrates arranged in any desired configuration. Alternatively, the multiple dispense regions may be distinct regions of a single substrate, as discussed above. In this regard, while dispense regions are primarily exemplified herein as multiple independent substrates, it will be appreciated that, alternatively, dispense regions may be part of single common substrate, for example as shown in FIG. 13B. In one embodiment, the dispense regions may be part of a panelized substrate, such as a panelized circuit board (not shown).

The carrier tray 32 may be positioned on a conveyor belt (not shown), which may be operated to deliver the carrier tray 32 to a position generally beneath the dispensing system 30 such that the substrates A-D carried therein may be dispensed upon by the dispensing system 30. Alternatively, the carrier tray 32 may be positioned on any other suitable platform, such as a stationary table or pedestal, located generally within an operating perimeter of the dispensing system 30. The dual dispensing system 30 includes a first fluid applicator 34 mounted to a primary positioner 36 and a second fluid applicator 38 mounted to a secondary positioner 40. The secondary positioner 40 is coupled to and movable by the primary positioner 36. The positioners 36, 40 collectively define a gantry 42 for positioning the first applicator 34 for dispensing at a first dispense region and the second applicator 38 for simultaneously dispensing at a second dispense region, as described in greater detail below.

The dual dispensing system 30 defines a global origin O and three mutually orthogonal global axes X, Y, and Z. The primary positioner 36 is movable in directions parallel to the global X, Y, and Z axes, denoted generally by $x_1$, $y_1$, and $z_1$, respectively, and corresponding directional arrows. Similarly, the secondary positioner 40 is also movable in directions parallel to the global X, Y, and Z axes, denoted generally by $x_2$, $y_2$, and $z_2$, respectively, and corresponding directional arrows.

The primary positioner 36 includes a pair of opposed $x_1$ supports 44a and 44b aligned parallel with the X axis and shown generally as longitudinal beams. The $x_1$ supports 44a, 44b are each provided with an $x_1$ bearing 46a and 46b, respectively, shown as linear bearings, for enabling $x_1$ linear movement of the applicators 34, 38 parallel to the X axis. The primary positioner 36 further includes a transversely oriented $y_1$ support 48 aligned parallel with the Y axis and shown generally as a lateral beam. The $y_1$ support 48 is provided with a pair of $y_1$ bearings 50a and 50b, shown as linear bearings, for enabling $y_1$ linear movement of the applicators 34, 38 parallel to the Y axis. The $y_1$ support 48 is movably coupled to the $x_1$ supports 44a, 44b through a pair of opposed legs 52a and 52b, which engage and are slidable along the $x_1$ bearings 46a, 46b, respectively, for $x_1$ movement. The primary positioner 36 further includes a $y_1$ carriage 54 having a lower XY surface that engages and is slidable along the $y_1$ bearings 50a, 50b for $y_1$ movement. The $y_1$ carriage 54 has a YZ surface (i.e., a surface lying in the YZ plane) to which is attached a vertically oriented $z_1$ support 56, aligned parallel with the Z axis and shown generally in the form of a plate. The $z_1$ support 56 includes a pair of vertically oriented $z_1$ bearings 58a and 58b, shown as linear bearings, for enabling $z_1$ linear movement of the applicators 34, 38 in a direction parallel to the Z axis. As shown, the $z_1$ bearings 58a, 58b may be provided on adjacent XZ and YZ surfaces, respectively, of the $z_1$ support 56. A $z_1$ carriage 60, shown in the form of an L-shaped bracket, has a first leg 62a and a second leg 62b that engage and are slidable along the $z_1$ bearings 58a, 58b, respectively, for $z_1$ movement. A first applicator mounting mechanism 64 may be coupled to the second leg 62b and may be configured to releasably support the first applicator 34, as described in greater detail below.

The secondary positioner 40 is coupled to the primary positioner 36 and enables $x_2$, $y_2$, and $z_2$ movements of the second applicator 38 relative to the primary positioner 36 and the first applicator 34 mounted thereon. The secondary positioner 40 includes a $y_2$ support 70 which may act as a base plate and may be rigidly coupled at a YZ surface to the first leg 62a of the $z_1$ carriage 60 of the primary positioner 36. The $y_2$ support 70 may include a pair of $y_2$ bearings 72a and 72b, shown as linear bearings, which may be positioned adjacent to each other on an opposed YZ surface of the $y_2$ support 70. The $y_2$ bearings 72a, 72b are aligned parallel with the Y axis to enable $y_2$ movement of the second applicator 38 relative to the primary positioner 36. The secondary positioner 40 further includes a $z_2$ support 74, shown generally as a plate. A YZ surface of the $z_2$ support 74 may engage and be slidable along the $y_2$ bearings 72a, 72b for $y_2$ movement. An opposed YZ surface of the $z_2$ support 74 may include a pair of $z_2$ bearings 76a and 76b, shown as linear bearings, which are aligned parallel with the Z axis to enable $z_2$ movement of the second applicator 38 relative to the primary positioner 36.

A $z_2$ carriage 78, shown generally in the form of a plate, may include a YZ surface that engages and is slidable along the $z_2$ bearings 76a, 76b for $z_2$ movement. An $x_2$ support 80 may be rigidly coupled to an XZ surface of the $z_2$ carriage 78, in a perpendicular orientation. Alternatively, the $x_2$ support 80 and the $z_2$ carriage 78 may be formed integrally. The $x_2$ support 80 may include an $x_2$ bearing 82, shown as a linear bearing, that is aligned parallel with the X axis to enable $x_2$ movement of the second applicator 38 relative to the primary positioner 36. A second applicator mounting mechanism 84 may engage and be slidable along the $x_2$ bearing 82 for $x_2$ movement, and may be configured to releasably support the second applicator 38, as described in greater detail below.

The first and second applicator mounting mechanisms 64, 84 may be configured to receive and releasably engage the first and second applicators 34, 38, respectively. For example, the applicator mounting mechanisms 64, 84 may each include a quick-disconnect feature (not shown) that enables proper alignment with the corresponding applicator 34, 38 through one or more projections and mating recesses. U.S. Pat. No. 6,214,117 and EP Patent No. 1 165 250 B1, the disclosures of which are hereby incorporated by reference herein, show prior art examples of quick disconnect mechanisms for mounting applicators to mechanisms for moving the applicators.

The first and second applicators 34, 38 may be of any preferred type suitable for a user's intended application, such as an air-operated needle valve or jet of the types made available by Nordson ASYMTEK of Carlsbad, Calif., for example. As shown best in FIGS. 4 and 5, each applicator 34, 38 may be in the form of a pneumatically operated jetting valve such as a model DJ 9000 valve available from Nordson ASYMTEK. As shown, each applicator 34, 38 may include a corresponding fluid reservoir 86, 88 for storing viscous fluid, an actuator 90, 92, for jetting, or dispensing, viscous fluid from a dispensing tip 94, 96 for application to a substrate A-D positioned beneath the dispensing tip 94, 96. An example of a suitable dispenser is shown in U.S. Pat. No. 8,578,729, the disclosure of which is hereby incorporated by reference herein. As discussed above, the viscous fluid may be any solder paste, underfill material, adhesive, or encapsulant, for example.

Movement of the primary and secondary positioners 36, 40 may be preferably accomplished through a series of controllable, powered drive mechanisms. More specifically, each direction of movement $x_1$, $y_1$, $z_1$, $x_2$, $y_2$, and $z_2$ may be powered by at least one corresponding powered drive mechanism. As shown, a pair of $x_1$ drive mechanisms 100a and 100b may operate in parallel to power $x_1$ movement along the $x_1$ bearings 46a, 46b, respectively, and may be provided internally within or adjacent to the legs 52a, 52b, respectively. Alternatively, $x_1$ movement may be powered by a single drive mechanism (not shown). A $y_1$ drive mechanism 102 may power $y_1$ movement along the $y_1$ bearings 50a, 50b and may be provided internally within or adjacent to the $y_1$ carriage 54, as shown. A $z_1$ drive mechanism 104 may power $z_1$ movement along the $z_1$ bearings 58a, 58b and may be provided adjacent to an external XZ surface of the $z_1$ support 56, as shown. A $y_2$ drive mechanism 106 may power $y_2$ movement along the $y_2$ bearings 72a, 72b and may be provided adjacent to an external XZ surface of the $y_2$ support 70, as shown. A $z_2$ drive mechanism 107 may power $z_2$ movement along the $z_2$ bearings 76a, 76b and may be provided adjacent to an external upper XY surface of the $z_2$ carriage 78, as shown. An $x_2$ drive mechanism 108 may power $x_2$ movement along the $x_2$ bearing 82 and may be provided adjacent to an external YZ surface of the second applicator mounting mechanism 84, as shown.

In one embodiment, the drive mechanisms 100a, 100b, 102, 104, 106, 107, 108 may include stepper motors. Alternatively, the drive mechanisms 100a, 100b, 102, 104, 106, 107, 108 may include any other suitable electric, pneumatic, or hydraulic drive adapted to movement with a high degree of accuracy, repeatability, and stability. Additionally, the drive mechanisms 100a, 100b, 102, 104, 106, 107, 108 may include any additional mechanical drive elements suitable for moving the positioners 36, 40. For example, in one embodiment (not shown) the drive mechanisms 100a, 100b, 102, 104, 106, 107, 108 may include stepper motors each having an output shaft connected with a flexible drive coupling to a lead screw. The lead screw may rotate with the motor and engages a threaded or toothed element mounted on a corresponding support to actuate movement along a corresponding linear bearing. The drive mechanisms 100a, 100b, 102, 104, 106, 107, 108 may be mounted at any suitable locations within the dispensing system 30 different from those shown and described herein.

As presented above, the secondary positioner 40 is coupled to the primary positioner 36 and thus the $x_1$, $y_1$, and $z_1$ movements of the primary positioner 36 are transferable to the secondary positioner 40 and the second applicator 38 mounted thereon. The secondary positioner 40 enables additional movements $x_2$, $y_2$, and $z_2$ relative to the primary positioner 36, which movements may be relatively fine in comparison to the corresponding $x_1$, $y_1$, and $z_1$ movements performed by the primary positioner 36. Accordingly, in one embodiment, the secondary positioner 40 is movable with ranges of motion that are less than corresponding ranges of motion of the primary positioner 36. More specifically, the primary positioner may have a range of motion in each of the directions parallel to the X axis, the Y axis, and the Z axis (i.e., $x_1$, $y_1$, and $z_1$ movements). Similarly, the secondary positioner 40 may have a range of motion in each of the directions parallel to the X axis, the Y axis, and the Z axis (i.e., $x_2$, $y_2$, and $z_2$ movements). The ranges of motion of the secondary positioner 40 may be smaller than the corresponding ranges of motion of the primary positioner 36. In this manner, the primary positioner 36 may perform a primary movement to move the first applicator 34 and the second applicator 38, the primary movement defined by any one or combination of $x_1$, $y_1$, and $z_1$ movements and having a magnitude. Simultaneously, the secondary positioner 40 may perform a secondary movement relative to the primary positioner 36 to move the second applicator 38 relative to the first applicator 34, the secondary movement defined by any one or combination of $x_2$, $y_2$, and $z_2$ movements and having a magnitude that is less than the magnitude of the primary movement.

Accordingly, the first applicator 34 may be positioned with the primary positioner 36, and the second applicator 38 may be jointly positioned by the primary positioner 36 and the secondary positioner 40. More specifically, the first applicator 34 and the second applicator 38 are both positionable with $x_1$, $y_1$, and $z_1$ movements. The second applicator 38 is additionally positionable with $x_2$, $y_2$, and $z_2$ movements made relative to the primary positioner 36. Thus, the structural configuration of the dispensing system 30 enables the second applicator 38 to be moved relative to the first applicator 34 in directions parallel to the X, Y, and Z axes. Thereby, the first and second applicators 34, 38 may simultaneously dispense first and second fluid patterns onto first and second substrates, respectively, where the fluid patterns are substantially identical in size and shape and where the substrates are misaligned relative to each other. As described above, the fluid patterns may include one or more lines, arcs, dots, combinations thereof, and/or any other configuration of continuously or intermittently dispensed fluid.

The primary positioner 36 and the secondary positioner 40 are independently controllable with at least one controller (not shown), such as a computer. Preferably, the controller is configured to instruct the $x_1$, $y_1$, and $z_1$ movements of the primary positioner 36, and to simultaneously instruct the $x_2$, $y_2$, and $z_2$ movements of the secondary positioner 40 by controlling the drive mechanisms 100a, 100b, 102, 104, 106, 107, 108. In this manner, the primary positioner 36 is controllable such that the first applicator 34 may be properly positioned relative to and dispense at a first dispense region, such as substrate A. Simultaneously, the secondary positioner 40 is independently controllable such that the second applicator 38 may be properly positioned relative to and dispense at a second dispense region, such as substrate B. As discussed in greater detail below, the positioners 36, 40 are controllable to account for misalignment between a first dispense region and a second dispense region, such as substrates A and B, for example.

Having just described a dispensing system that is novel in structure, methods of simultaneously dispensing at first and second dispense regions will now be described. The methods are described herein with reference to substrates A, B, C, D shown in FIGS. 6-11. As discussed above, persons skilled in the art will appreciate that the dispensing methods described herein may be adapted for simultaneously dispensing at any two dispense regions of a plurality of dispense regions with the dispensing system 30. For example, first and second dispense regions may be part of a single substrate, such as a panelized substrate.

The dispensing system 30 may first identify the location and orientation of each substrate A, B, C, D in the XY plane relative to a global origin O, based on the positions of at least two reference fiducials 110a, 110b provided on each substrate A-D. For example, with reference to substrate A, the two fiducials 110a, 110b may be provided at opposing corners of an upper XY surface of the substrate A. While shown herein as an "x" enclosed by a circle, the fiducials 110a, 110b may be any identifiable mark such as a letter, number, dot, or pattern, for example. In this manner, the dispensing system 30 may determine whether each substrate is rotated and/or translated in the XY plane relative to a corresponding reference position defined with respect to origin O.

Figure 6:
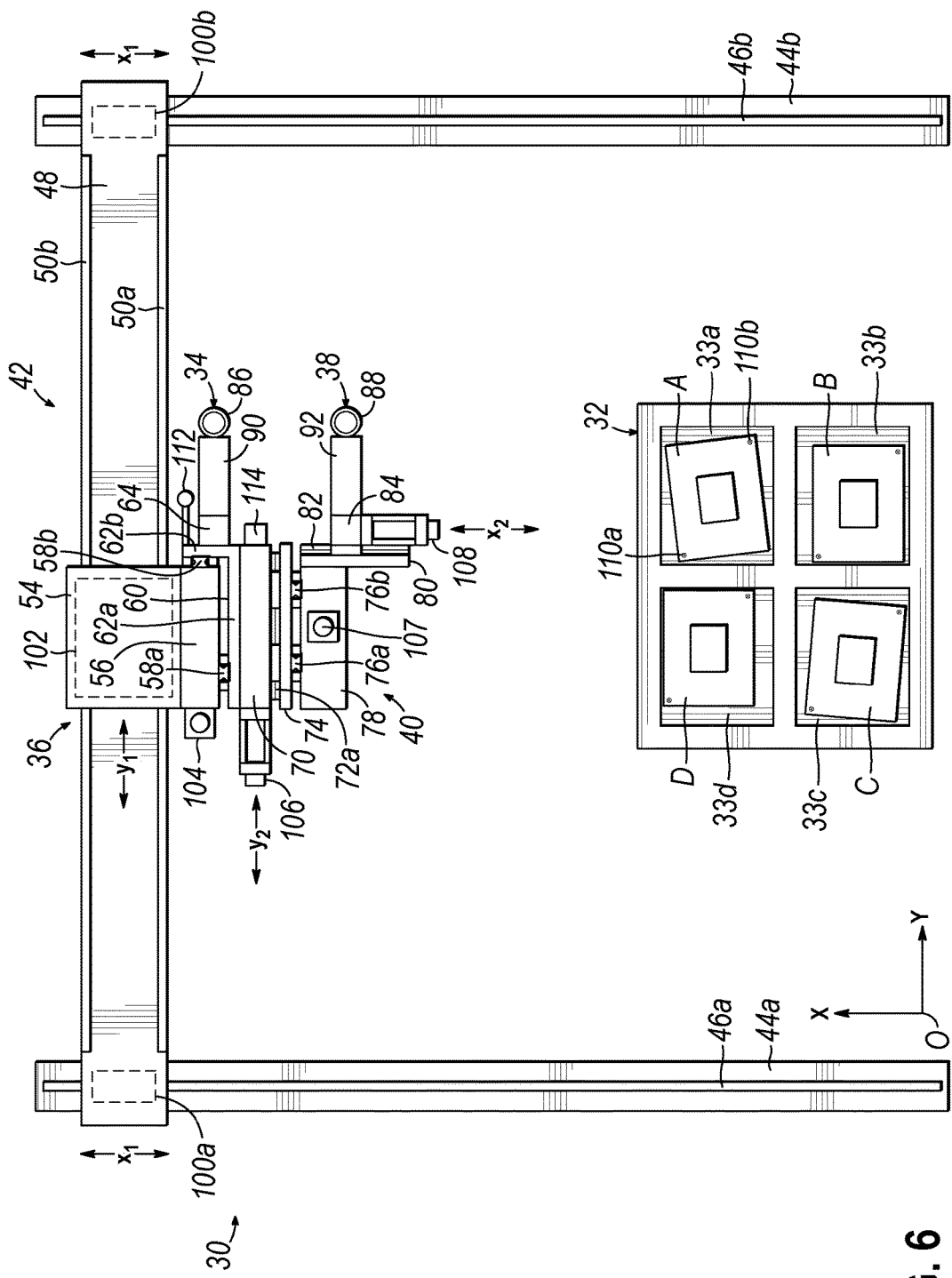
FIG. 6 is a top elevational view of the dispensing system of FIG. 4, further showing a parts carrier tray in which the substrates are each rotated or translated from their centered orientations.

The dual dispensing system 30 includes a camera 112 for identifying the reference fiducials 110a, 110b. The camera 112 may be mounted to the gantry 42 at any suitable location, such as a portion of the secondary positioner 40, as shown in FIG. 6. For fiducial identification, the gantry 42 may be controlled to move the camera 112 along a pre-programmed path based on expected locations of the fiducials 110a, 110b in the XY plane. In one mode, the gantry 42 may be controlled to sequentially pause at the expected location of each fiducial 110a, 110b so that the camera 112 may capture a visual image of a fiducial 110a, 110b during each pause. In another mode, the gantry 42 may be controlled to continuously move and the camera 112 may capture visual images of the fiducials 110a, 110b during movement. Based on the images of the fiducials 110a, 110b captured by the camera 112, the controller may then determine the actual position of each substrate A, B, C, D in the XY plane.

The dual dispensing system 30 further includes a height sensor 114 for performing height sensing operations, which includes measuring the position of each substrate A-D along the Z axis, relative to the XY plane. The height sensor 114 may be a non-contact laser sensor, or alternatively may be a contact mechanical sensor. In operation, the gantry 42 may be controlled to move the height sensor 114 along a pre-programmed path for measuring the position each substrate A-D along the Z axis. These measurements, referred to herein as Z height measurements, enable the controller to determine for each substrate A-D a proper height along the Z axis, referred to as a dispense height, to which the dispensing tip 94, 96 of the first or second applicator 34, 38 should be lowered for dispensing fluid onto the substrate A-D. In this manner, the system 30 may ensure a proper dispense gap between the dispensing tips 94, 96 and the corresponding substrates A-D while dispensing.

Figure 3:
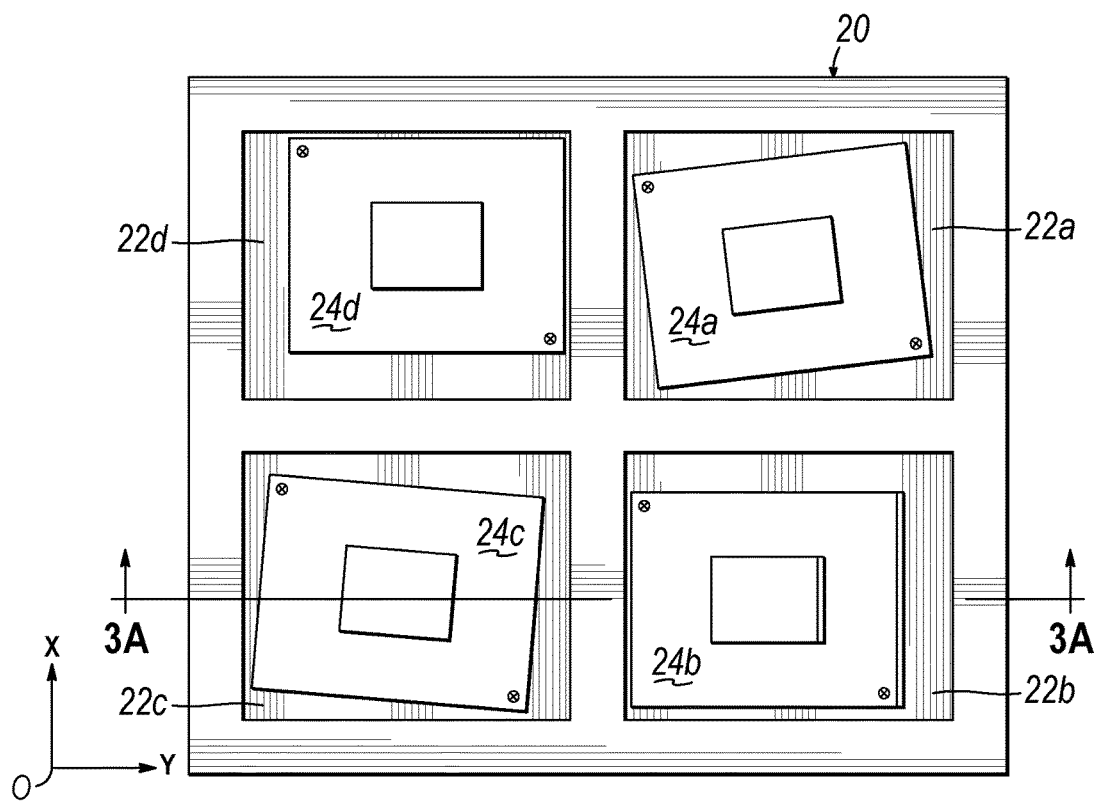
FIG. 3 is a top elevational view similar to FIG. 2, showing a substrate tilted relative to a horizontal XY plane.
Figure 3A:
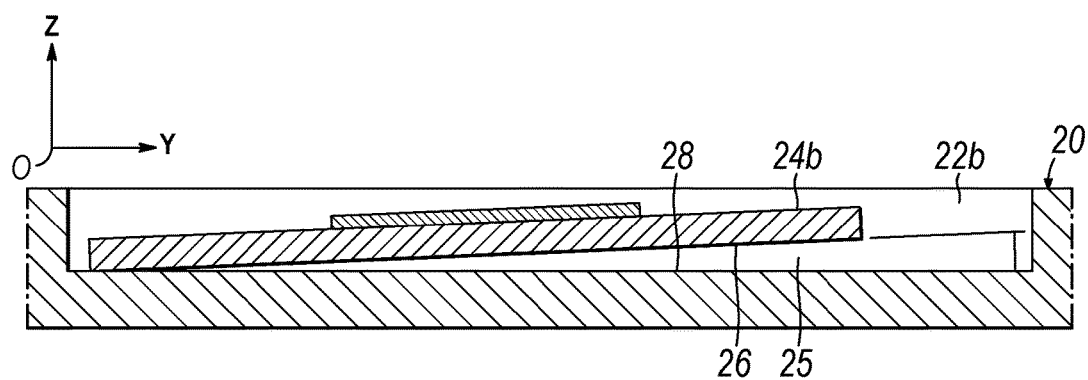
FIG. 3A is a side cross-sectional view taken along line 3A-3A of FIG. 3, showing the substrate tilted relative to the horizontal XY plane.

As shown in FIG. 6, the substrates A-D may lie generally parallel to the XY plane, and thus a single height measurement for each substrate A-D may be sufficient. Alternatively, one or more of the substrates A-D may be tilted relative to the XY plane (see, e.g., FIGS. 3A, 12A) such that the substrate is positioned at various points along the Z axis. In such case, the height sensor 114 may be operated to measure multiple heights of the tilted substrate and thereby map the tilt along the Z axis. Similarly, multiple Z height measurements may also be collected for a substrate having a surface, onto which fluid is to be dispensed, that is contoured relative to the XY plane and along the Z axis (referred to herein as a "contoured substrate," and similar variations thereof), as shown in FIGS. 12B-13B. As described in greater detail below, the multiple Z height measurements collected for a tilted and/or contoured substrate may then be used by the controller to determine $z_1$ or $z_2$ movements that the primary positioner 36 or the secondary positioner 40 must actively perform during dispensing in order to accommodate the tilted orientation of the substrate or its contoured surface. The camera 112 and height sensor 114 may be integrated into a single system operable by the controller for collecting fiducial information and height measurements for each of the substrates A-D to be dispensed upon.

Based on the information gathered by the controller during the fiducial locating and height sensing operations described above, the primary and secondary positioners 36, 40 may be operated to simultaneously position the first applicator 34 relative to a first substrate and the second applicator 38 relative to a second substrate. The first applicator 34 may then dispense a first fluid pattern onto the first substrate while the second applicator 38 simultaneously dispenses a second, identical fluid pattern onto the second substrate. The positioners 36, 40 are automatically movable while dispensing to actively correct for any positional misalignment of one of the substrates relative to the other. These positioning and dispensing steps may be performed with respect to any two of the substrates A-D, for example, which are each rotated and/or translated along the X and Y axes relative to each of the other substrates A-D, as shown in FIGS. 6-11.

Figure 1:
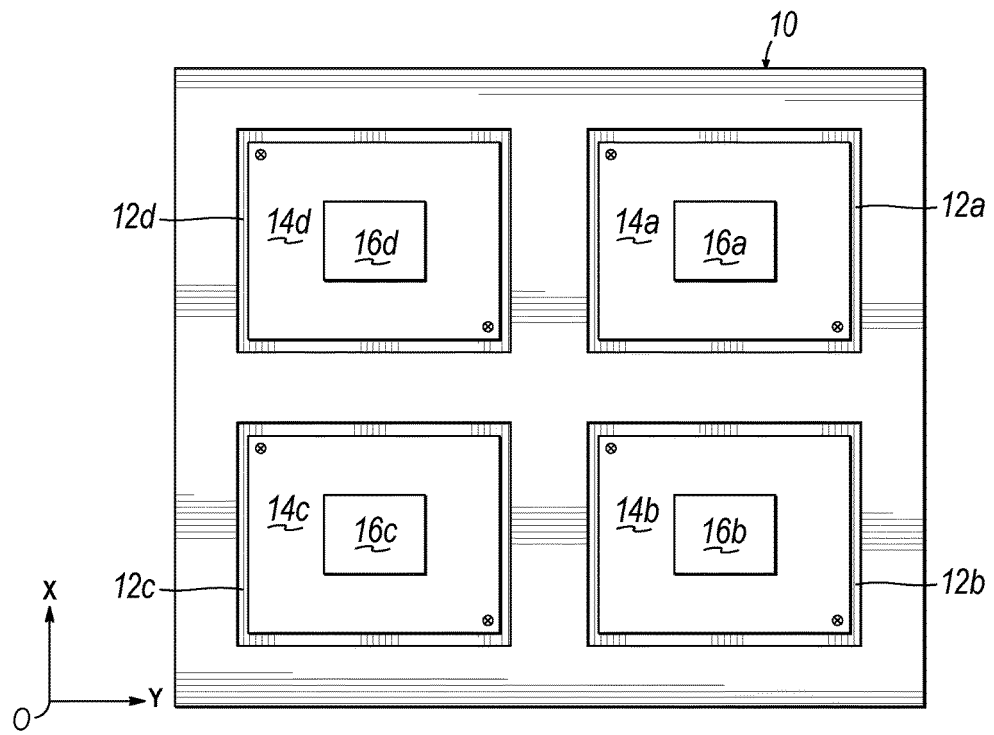
FIG. 1 is a top elevational view showing a carrier tray containing a plurality of substrates each aligned in proper, centered orientations.
Figure 2:
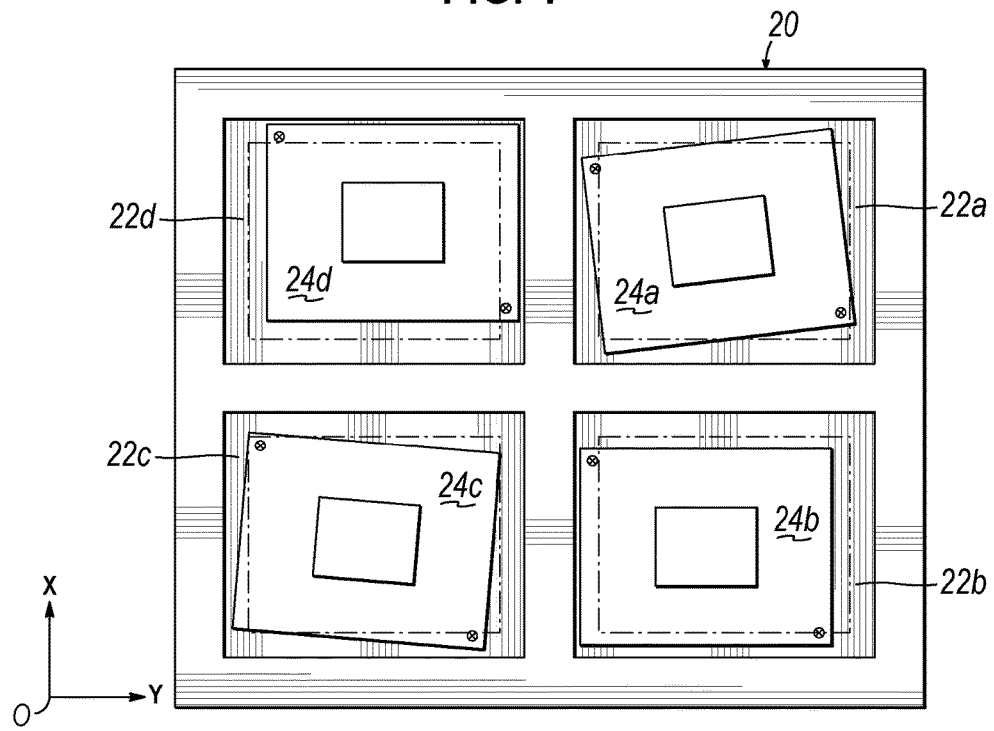
FIG. 2 is a top elevational view showing a carrier tray containing a plurality of substrates each rotated or translated from their centered orientations.

FIGS. 7-11 show a series of steps in which the first applicator 34 is positioned relative to substrate A and dispenses a fluid pattern 116 thereon. Simultaneously, the second applicator 38 is positioned relative to substrate B and dispenses a substantially identical fluid pattern 118 thereon. Substrates A and B are shown each misaligned from their respective centered positions within their respective pockets 33a, 33b (see, e.g., FIG. 2). The geometric centers of the pockets 33a, 33b in the XY plane are represented by crosshairs. As shown, substrate A is rotated from its centered position relative to the X and Y axes, while substrate B is translated from its centered position along the X and Y axes. Accordingly, substrates A and B are rotated and translated relative to each other with respect to the X and Y axes. As described below, the second applicator 38 is movable in the XY plane relative to the first applicator 34 while dispensing to thereby actively and automatically correct for misalignments of the substrates A, B in the XY plane.

As shown, the first and second applicator dispensing tips 94, 96 are each represented in FIGS. 7-11 by a pair of concentric phantom circles. The shapes of the fluid patterns 116, 118 to be dispensed are represented by directional arrows forming generally rectangular outlines about the perimeters of components 120a, 120b provided on the substrates A, B. Accordingly, FIGS. 7-11 simulate dispensing of an adhesive underfill material which is dispensed along the edge of a component, such as a flip chip having a grid of solder balls on its underside which are positioned on corresponding matching contact pads on the substrate, with the underfill material flowing under the chip and around the solder balls to secure the flip chip to the substrate. Persons of ordinary skill in the art will appreciate that the positioners 36, 40 and the applicators 34, 38 mounted thereon may be controlled to dispense fluid patterns of any other desired shape and at any other desired region of one or more substrates or other similar workpieces. For example, as discussed above, the fluid patterns may include one or more lines, arcs, dots, combinations thereof, and/or any other configuration of continuously or intermittently dispensed fluid.

Figure 7:
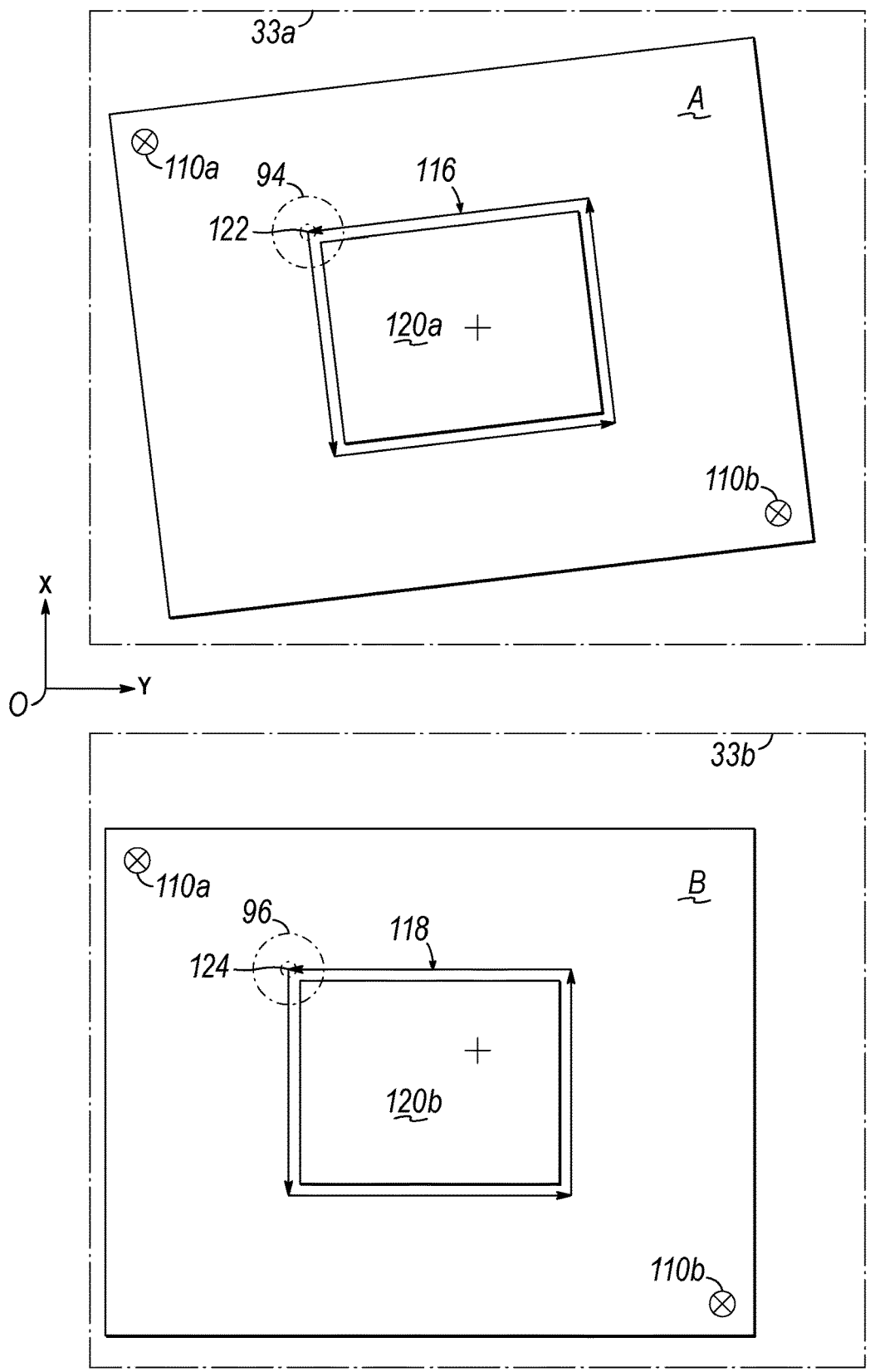
FIG. 7 is a top elevational view of first and second substrates of FIG. 6, showing positions of first and second applicator dispense tips prior to dispensing first and second fluid patterns.

Referring to FIG. 7, the controller may command the primary positioner 36 to execute $x_1$ and $y_1$ movements to thereby position the first applicator dispensing tip 94 to overlie a first dispense site 122 on substrate A. Simultaneously, the controller may command the secondary positioner 40 to execute $x_2$ and $y_2$ movements relative to the primary positioner 36 to thereby position the second applicator dispensing tip 96 over a corresponding first dispense site 124 on substrate B. The controller may then command the primary positioner 36 to execute downward $z_1$ movement to thereby advance the first and second dispensing tips 94, 96 simultaneously toward their proper dispense heights, as determined during the height sensing operation described above. If the controller determines, through the height sensing operation, that substrates A and B are each positioned at the same location along the Z axis, the first and second dispensing tips 94, 96 may be positioned at the same dispense height through $z_1$ movement of the primary positioner 36. If the controller determines, through the height sensing operation, that substrates A and B are positioned at different locations along the Z axis, the controller may additionally command the secondary positioner 40 to execute $z_2$ movement relative to and simultaneously with the $z_1$ movement of the primary positioner 36. Thereby, the first and second dispensing tips 94, 96 may be simultaneously positioned at their proper, respective dispensing heights. The dispensing system 30 may now dispense onto substrates A and B.

Figure 8:
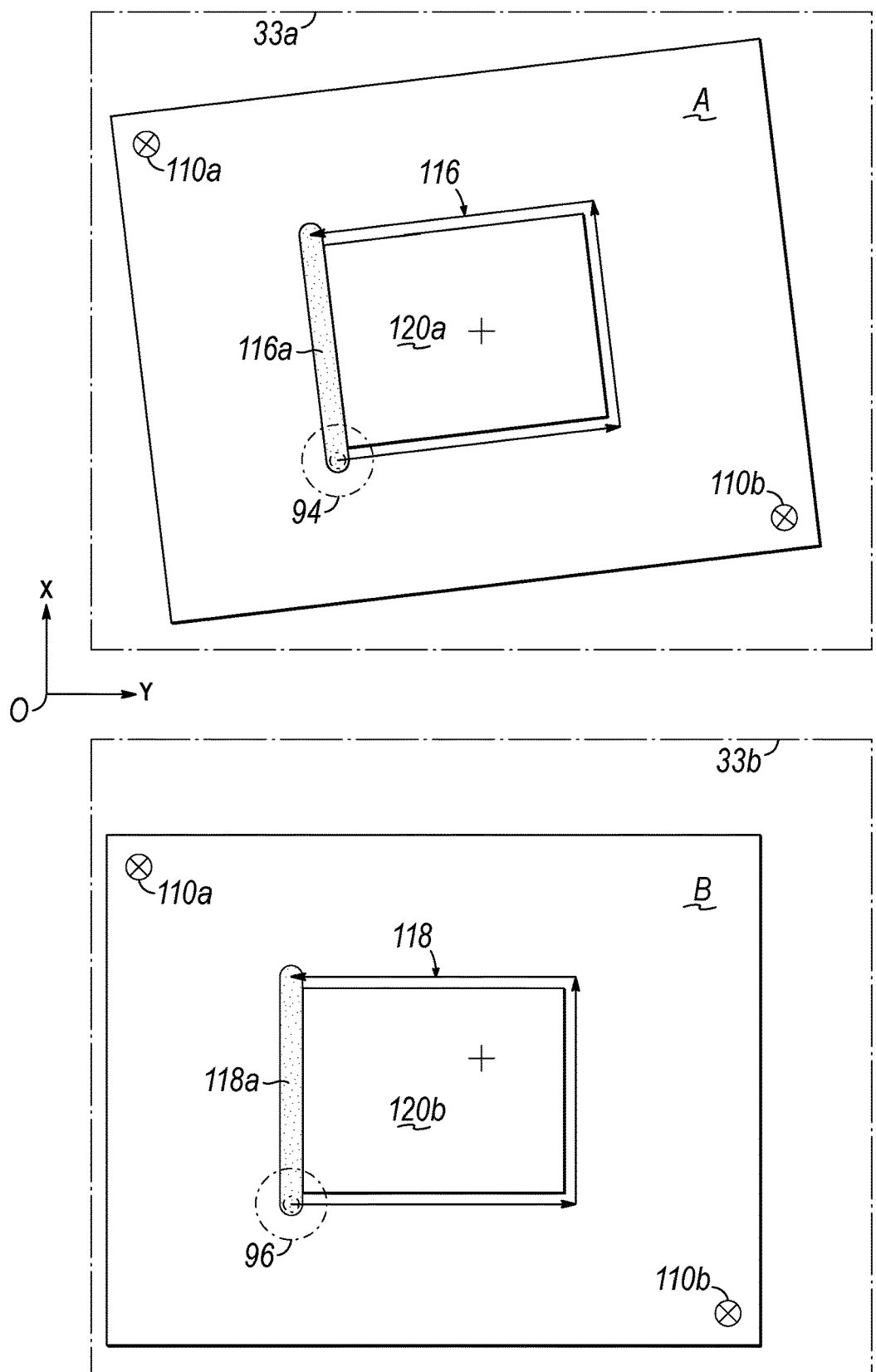
FIG. 8 is a top elevational view similar to FIG. 7, showing positions of the applicator dispense tips after dispensing first portions of the fluid patterns.

As shown in FIG. 8, the first applicator 34 and its dispensing tip 94 may be moved by the primary positioner 36 to dispense a first leg 116a of fluid pattern 116. Simultaneously, the second applicator 38 and its dispensing tip 96 may be moved by the secondary positioner 40 relative to the primary positioner 36 and the first applicator 34 to dispense a first leg 118a of fluid pattern 118. More specifically, the controller may command the primary positioner 36 to execute $x_1$ and $y_1$ movements, and further command the secondary positioner 40 to simultaneously execute corrective $x_2$ and $y_2$ movements relative to the primary positioner 36. The controller may issue such commands based on the known locations and orientations of the substrates A, B in the XY plane as determined by the controller during the fiducial identification process described above. In this manner, the dispensing system 30 may automatically and actively adjust positioning of the first and second applicators 34, 38 while dispensing to correct for local rotation of substrates A and B.

Figure 9:
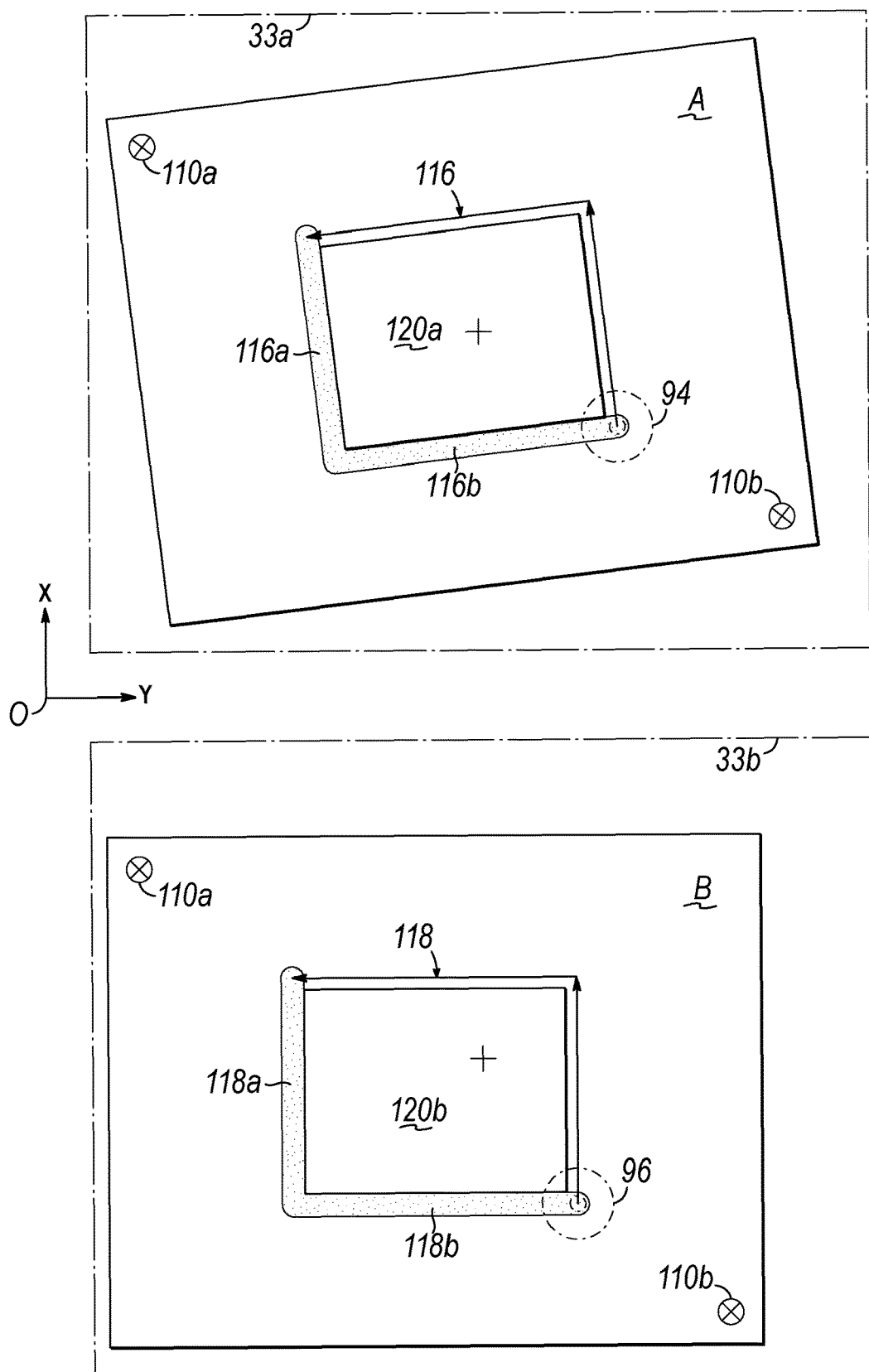
FIG. 9 is a top elevational view similar to FIG. 7, showing positions of the applicator dispense tips after dispensing second portions of the fluid patterns.

As shown in FIG. 9, the first applicator 34 and its dispensing tip 94 may be moved by the primary positioner 36 to dispense a second leg 116b of fluid pattern 116. Simultaneously, the second applicator 38 and its dispensing tip 96 may be moved by the secondary positioner 40 relative to the primary positioner 36 and the first applicator 34 to dispense a second leg 118b of fluid pattern 118. More specifically, the controller may command the primary positioner 36 to execute $x_1$ and $y_1$ movements, and further command the secondary positioner 40 to simultaneously execute corrective $x_2$ and $y_2$ movements relative to the primary positioner 36 while dispensing to correct for the local rotation of substrates A and B.

Figure 10:
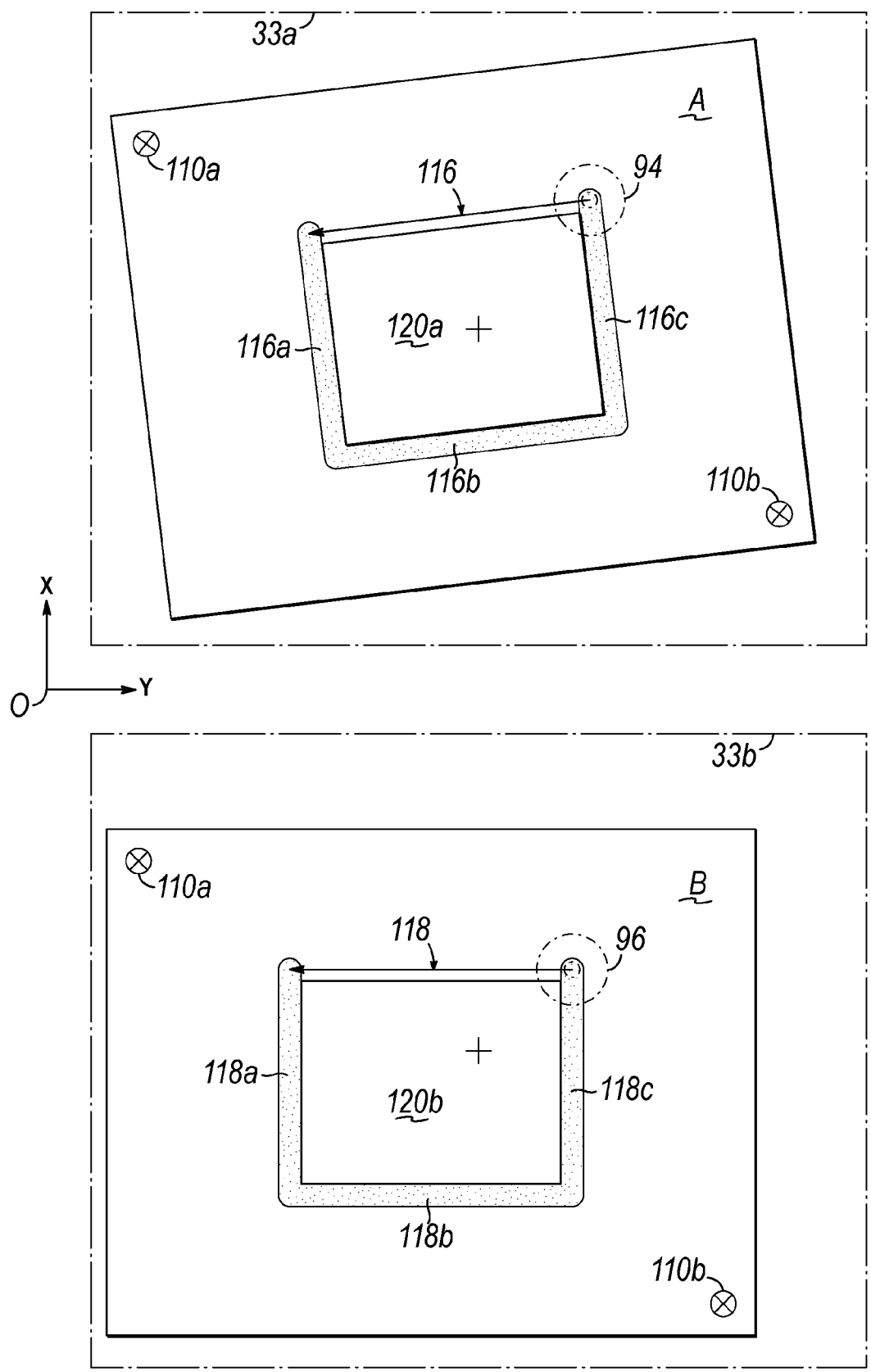
FIG. 10 is a top elevational view similar to FIG. 7, showing positions of the applicator dispense tips after dispensing third portions of the fluid patterns.

As shown in FIG. 10, the first applicator 34 and its dispensing tip 94 may be moved by the primary positioner 36 to dispense a third leg 116c of fluid pattern 116. Simultaneously, the second applicator 38 and its dispensing tip 96 may be moved by the secondary positioner 40 relative to the primary positioner 36 and the first applicator 34 to dispense a third leg 118c of fluid pattern 118. More specifically, and as similarly performed when dispensing the first legs 116a, 118a, the controller may command the primary positioner 36 to execute $x_1$ and $y_1$ movements, and simultaneously the controller may command the secondary positioner 40 to execute corrective $x_2$ and $y_2$ movements relative to the primary positioner 36 to correct for the local rotation of substrates A and B.

Figure 11:
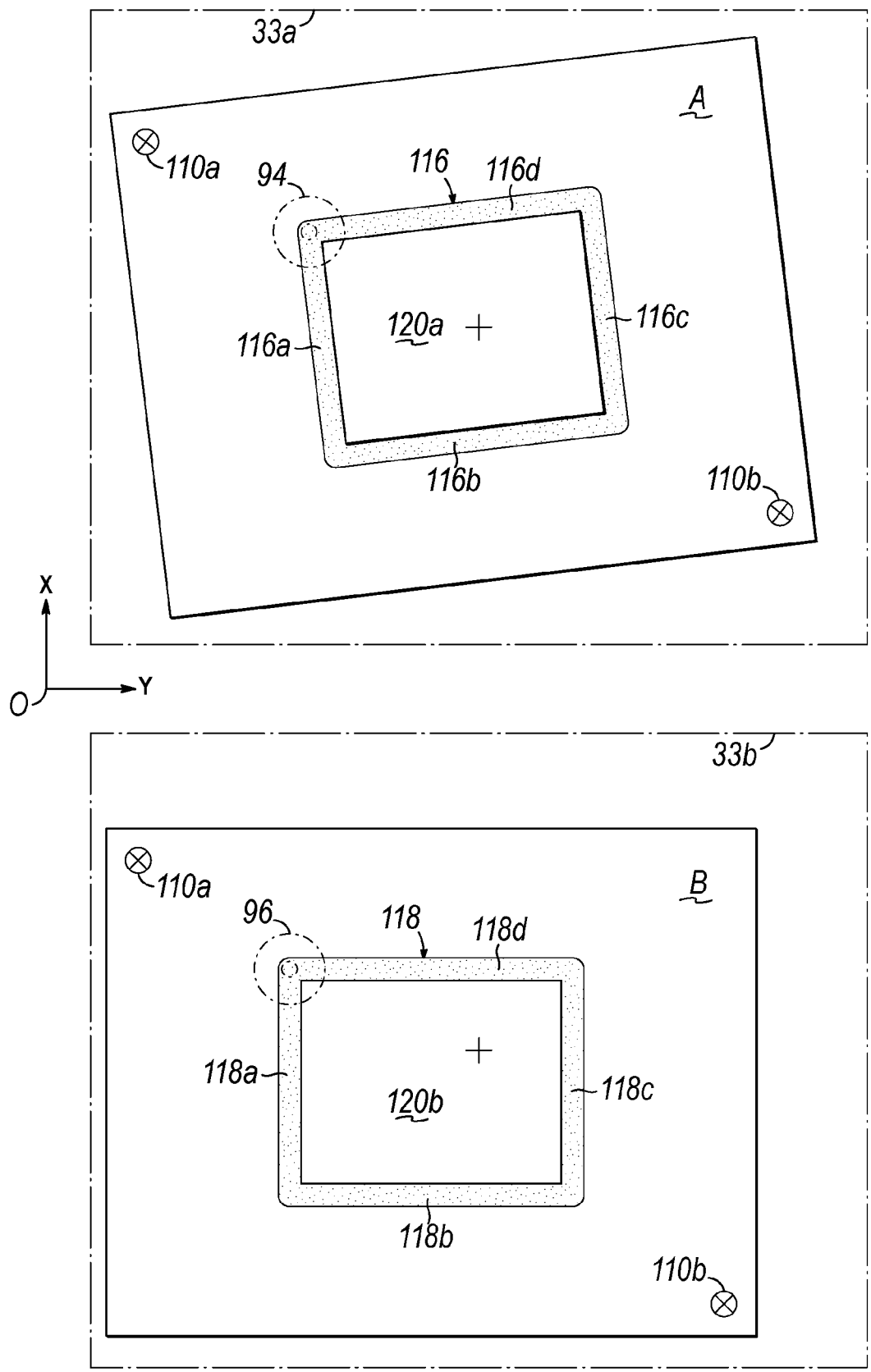
FIG. 11 is a top elevational view similar to FIG. 7, showing positions of the applicator dispense tips after dispensing fourth portions of the fluid patterns.

As shown in FIG. 11, the first applicator 34 and its dispensing tip 94 may be moved by the primary positioner 36 to dispense a fourth leg 116d of fluid pattern 116. Simultaneously, the second applicator 38 and its dispensing tip 96 may be moved by the secondary positioner 40 relative to the primary positioner 36 and the first applicator 34 to dispense a fourth leg 118d of fluid pattern 118, thereby completing the fluid patterns 116, 118. More specifically, and as similarly performed when dispensing the second legs 116b, 118b, the controller may command the primary positioner 36 to execute $x_1$ and $y_1$ movements, and simultaneously the controller may command the secondary positioner 40 to execute corrective $x_2$ and $y_2$ movements relative to the primary positioner 36 to correct for the local rotation of substrates A and B.

Figure 12A:
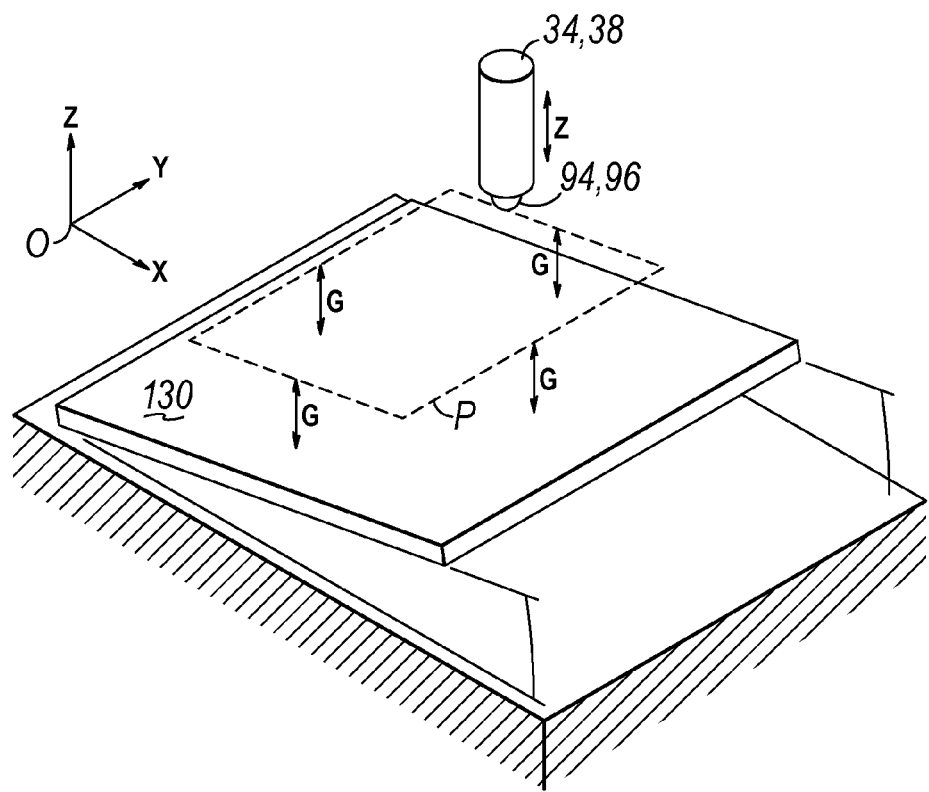
FIG. 12A is an isometric view showing a substrate that is tilted relative to an XY plane, and a corresponding dispense height path along which an applicator moves while dispensing onto the tilted substrate.

One or both of the substrates A, B may be tilted relative to the XY plane, as demonstrated by substrate 130 in FIG. 12A. As described above, the height sensor 114 may be operated to collect multiple height measurements of a tilted substrate along the Z axis, and these measurements may then be conveyed to the controller. As shown in FIG. 12A, the controller may then determine a dispense height path P that varies in height along the Z axis and along which a corresponding dispensing tip 94, 96 may be moved in order to maintain a constant and accurate dispense gap G between the tip 94, 96 and the tilted substrate 130. Thus, if the substrate B of FIGS. 7-11, and its corresponding component 120b, had a tilt like that shown for substrate 130, in addition to making the $x_2$ and $y_2$ corrections as described above, the secondary positioner 40 would make corrective $z_2$ movements relative to the primary positioner 36, while dispensing, to correct for the tilt of substrate B with respect to substrate A. In this manner, the system 30 may accurately dispense a fluid pattern, such as pattern 118, onto the tilted substrate. Consequently, as shown in FIG. 12A, corrective $z_2$ movements would be made along the Z axis such that the dispensing tip 96 travels in a plane substantially parallel to the tilted substrate.

Figure 12B:
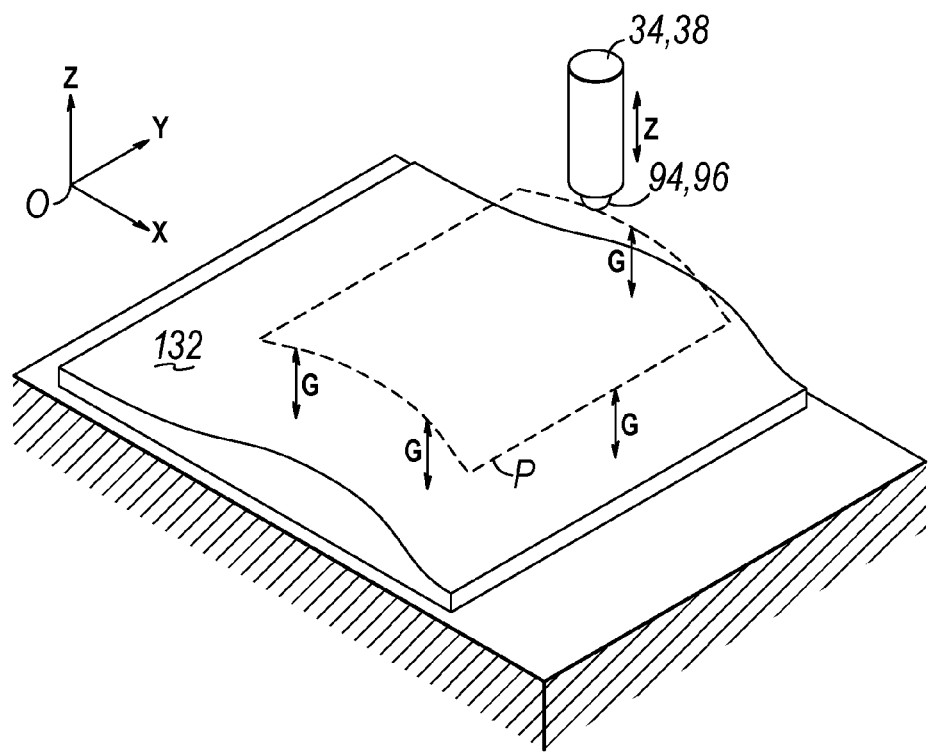
FIG. 12B is an isometric view showing a substrate that is contoured relative to the XY plane, and a corresponding dispense height path along which an applicator moves while dispensing onto the contoured substrate.

A similar process may be performed where one or both of the substrates A, B is contoured relative to the XY plane, along the Z axis, as demonstrated by substrate 132 in FIG. 12B, which could be a warped substrate, for example. In particular, the system may collect multiple Z height measurements corresponding to a contoured substrate. As shown in FIG. 12B, the system 30 may then determine a corresponding dispense height path P that varies in height along the Z axis and along which a corresponding dispensing tip 94, 96 may be moved in order to maintain a constant and accurate dispense gap G between the tip 94, 96 and the contoured substrate 132. The process described above with respect to the tilted substrate shown in FIG. 12A may also be applied to contoured substrates. For example, if the substrate B shown in FIGS. 7-11 had a contour like that shown for substrate 132, in addition to making the $x_2$ and $y_2$ corrections as described above, the secondary positioner 40 would also make corrective $z_2$ movements relative to the primary positioner 36, while dispensing, to correct for the contour of substrate B with respect to substrate A. In this manner, the system 30 may accurately dispense a fluid pattern, such as fluid pattern 118, onto the contoured substrate. Consequently, as shown in FIG. 12B, corrective $z_2$ movements would be made along the Z axis such that the dispensing tip 96 travels along a path that substantially conforms to the contoured substrate.

Figure 13A:
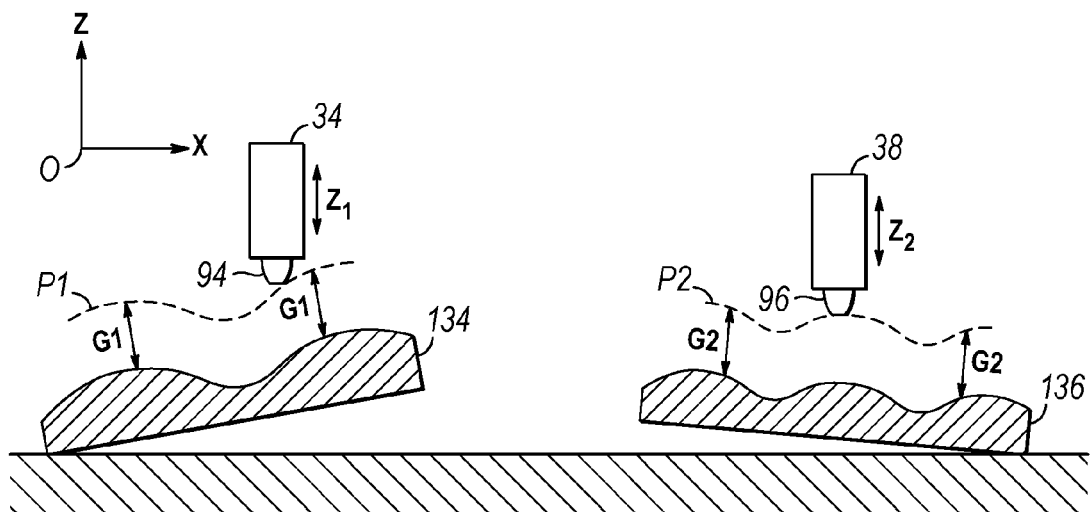
FIG. 13A is side elevational view showing first and second dispense regions provided on first and second substrates that are each uniquely tilted and contoured relative to the XY plane, and a unique dispense height path corresponding to each dispense region.
Figure 13B:
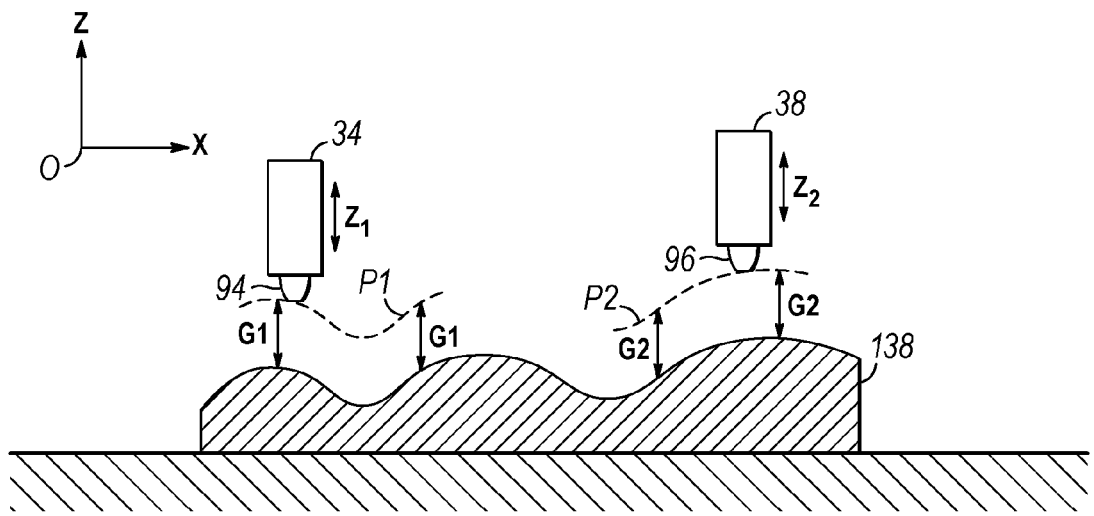
FIG. 13B is a side elevational view showing first and second dispense regions provided on a single contoured substrate, and a unique dispense height path corresponding to each dispense region.

As demonstrated by substrates 134 and 136 in FIG. 13A, two substrates being dispensed upon, for example substrates A and B, may each be uniquely tilted and contoured relative to the XY plane and relative to each other, and corresponding dispense height paths P1 and P2 may be determined by the system 30 based on the detected Z height measurements. In another embodiment, instead of using a height sensor, electronic data defining the tilt and/or contour of a substrate may be entered into the system 30 by a user. Such electronic data may then be used to determine a dispense height path.

In another embodiment (not shown), first and second substrates may be arranged such that they are not rotated relative to each other in the XY plane, and each substrate is provided with the same tilt and/or contour relative to the XY plane such that the substrates are not uniquely tilted or contoured relative to each other. In such case, the dispense height paths determined by the system 30 for the substrates may be substantially identical, and the secondary positioner 40 need not make corrective movements relative to the primary positioner 36 during dispense. In other words, the first and second applicators may remain stationary relative to each other while moving together along X, Y, and Z to simultaneously dispense on the first and second substrates.

With reference to substrates A and B of FIGS. 6-11, a first scenario, also described above, may arise in which substrate A is generally planar and lies parallel to the XY plane, and substrate B is tilted relative to the XY plane and/or includes a contoured surface, as demonstrated by substrates 130 and 132 of FIGS. 12A and 12B. In such case, the controller may determine a dispense height path for tilted and/or contoured substrate B based on height measurements collected during the height sensing operation discussed above. Then, while the first applicator 34 is moved in the XY plane to dispense onto substrate A and the second applicator 38 is simultaneously moved in the XY plane to dispense onto substrate B, the controller may command the secondary positioner 40 to simultaneously execute $z_2$ movements relative to the primary positioner 36. Thereby, the second dispensing tip 96 is movable along the pre-determined dispense height path while the second applicator 38 dispenses onto tilted and/or contoured substrate B. In this manner, the dispensing system 30 may automatically and actively adjust the positioning of the second applicator 38 along the Z axis to correct for tilt and/or contour of substrate B relative to the XY plane.

In a second scenario, substrate A may be tilted and/or contoured relative to the XY plane, as demonstrated by substrates 130 and 132 of FIGS. 12A and 12B, while substrate B is generally planar and lies parallel to the XY plane. In such case, the controller may determine a dispense height path for tilted and/or contoured substrate A in a manner as described above. Then, while the first applicator 34 is moved in the XY plane to dispense onto tilted and/or contoured substrate A, the controller may command the primary positioner 36 to simultaneously execute $z_1$ movements. Thereby, the first dispensing tip 94 is movable along the pre-determined dispense height path while the first applicator 34 dispenses onto tilted and/or contoured substrate A. Simultaneously, the second applicator 38 is moved in the XY plane to dispense onto substrate B, and the controller may command the secondary positioner 40 to execute $z_2$ movements relative to the primary positioner 36, the $z_2$ movements being substantially opposite of the $z_1$ movements made by the primary positioner 36. Thereby, the second dispensing tip 96 may be maintained at a constant, pre-determined dispense height corresponding to substrate B while the second applicator 38 dispenses onto part B.

In a third scenario, both substrates A and B may be tilted and/or contoured relative to the XY plane. By way of example with reference to FIG. 13A, substrate A may correspond to substrate 134 and substrate B may correspond to substrate 136. In this regard, substrate A may be provided with a first tilt and/or a first contour that is unique to substrate A, and substrate B may be provided with a second tilt and/or a second contour that is unique to substrate B. The controller may determine a first dispense height path P1 corresponding to tilted and/or contoured substrate A and a second dispense height path P2 corresponding to tilted and/or contoured substrate B, in a manner as described above. Then, while the first applicator 34 is moved in the XY plane to dispense onto substrate A, the controller may command the primary positioner 36 to simultaneously execute $z_1$ movements. Thereby, the first dispensing tip 94 is movable along the first dispense height path P1 to maintain a first dispense gap G1, while the first applicator 34 dispenses onto substrate A. Simultaneously, while the second applicator 38 is moved in the XY plane to dispense onto tilted and/or contoured substrate B, the controller may command the secondary positioner 40 to execute $z_2$ movements relative to the primary positioner 36 to correct both for the $z_1$ movements executed by the primary positioner 36 and the unique tilt and/or contour of substrate B. Thereby, the second dispensing tip 96 is movable along the second dispense height path P2 to maintain a second dispense gap G2, while the second applicator 38 dispenses onto substrate B. In this manner, the first applicator 34 may accurately dispense onto a uniquely tilted and/or contoured first substrate and simultaneously the second applicator 38 may accurately dispense onto a uniquely tilted and/or contoured second substrate.

In an alternative embodiment similar to the third scenario described above, the first and second applicators 34, 38 may simultaneously dispense first and second fluid patterns at first and second dispense regions, respectively, that are each distinct regions of a single common substrate. For example, as shown in FIG. 13B, the primary positioner 36 may execute $z_1$ movements to move the first applicator 34 along a first dispense height path P1 at a first uniquely contoured dispense region of substrate 138. Thereby, a first dispense gap G1 associated with the first dispense region may be maintained while dispensing. Simultaneously, the secondary positioner 40 may execute $z_2$ movements to move the second applicator 38 along a second dispense height path P2 at a second uniquely contoured dispense region of the substrate 138. Thereby, a second dispense gap G2 associated with the second dispense region may be maintained while dispensing. In various embodiments, the first and second dispense gaps G1, G2 may be the same or they may be different.

In a fourth scenario, substrates A and B may both be generally planar and lie parallel to the XY plane but positioned at different distances along the Z axis relative to the XY plane. For example, substrate A may lie in the XY plane, while substrate B is spaced above the XY plane. In such case, neither substrate A nor B is tilted or contoured relative to the XY plane, and thus active correction along the Z axis during dispense is not required by either applicator 34, 38. The controller may determine an appropriate dispense height for each substrate A, B in the manner described above. Prior to dispensing, the controller may command the primary positioner 36 to execute $z_1$ movement to lower the first dispensing tip 94 to its corresponding dispense height along the Z axis above substrate A. Simultaneously, the controller may command the secondary positioner 40 to execute $z_2$ movement relative to the primary positioner 36 to lower the second dispensing tip 96 to its corresponding dispense height along the Z axis above substrate B. The controller may then command the primary positioner 36 to move the first and second applicators 34, 38 together in the XY plane so that they may simultaneously dispense first and second fluid patterns onto substrates A and B, respectively, while maintaining the corresponding dispense heights for the applicators 34, 38.

In view of the disclosure above, persons of ordinary skill in the art will appreciate that the dispensing system 30 is capable of executing $x_1$, $y_1$, and $z_1$ movements with the primary positioner 36 and simultaneously executing $x_2$, $y_2$, and $z_2$ movements with the secondary positioner 40. Moreover, these movements are executable while the first applicator 34 dispenses at a first dispense region, such as a first substrate, and the second applicator 38 simultaneously dispenses at a second dispense region, such as a second substrate. In this manner, the dispensing system 30 is controllable to automatically and actively adjust positioning of the first and second applicators 34, 38 while dispensing to correct for misalignment of first and second substrates being dispensed upon.

Figure 14A:
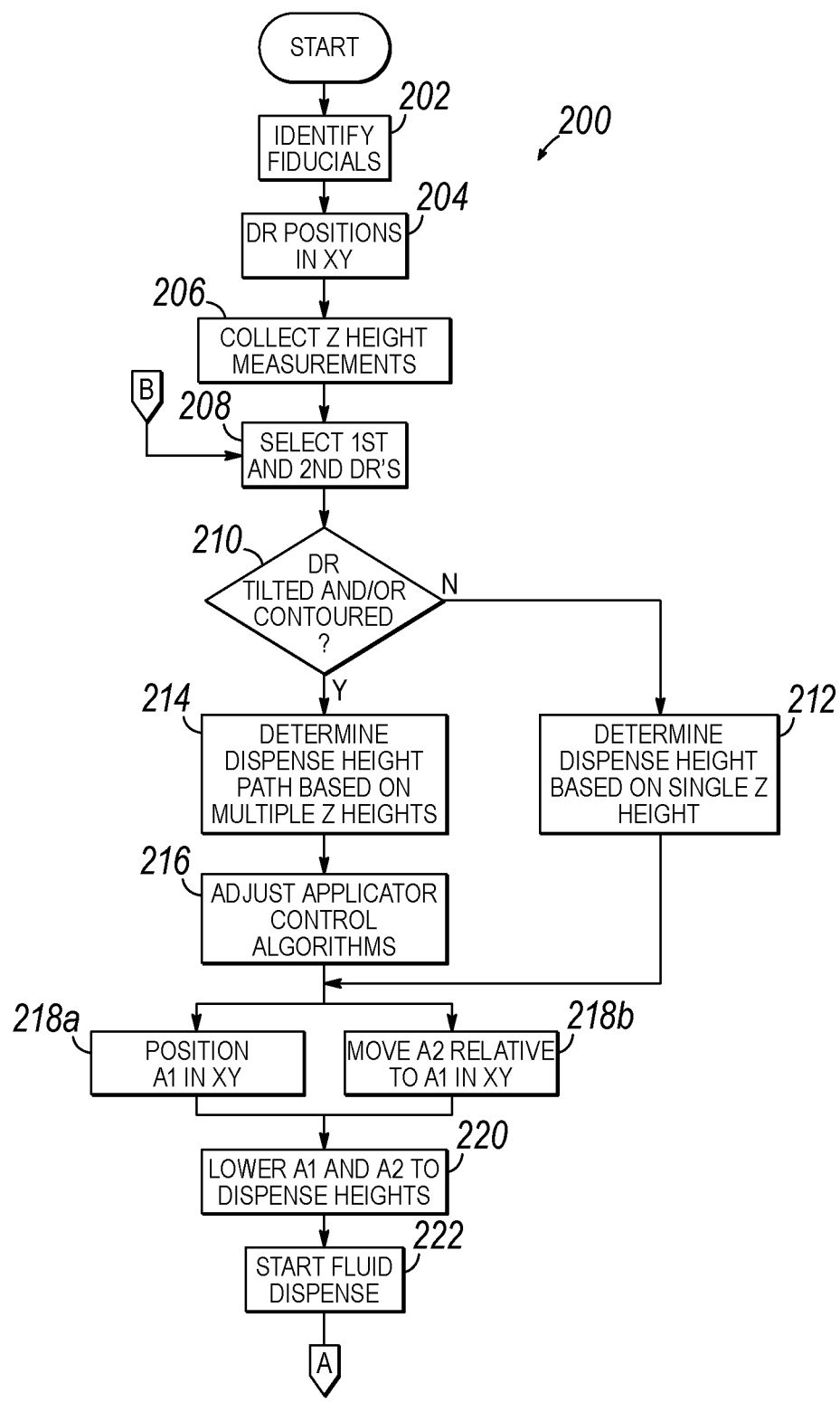
FIGS. 14A and 14B present a flow diagram illustrating steps of a method for simultaneously dispensing at first and second dispense regions.
Figure 14B:
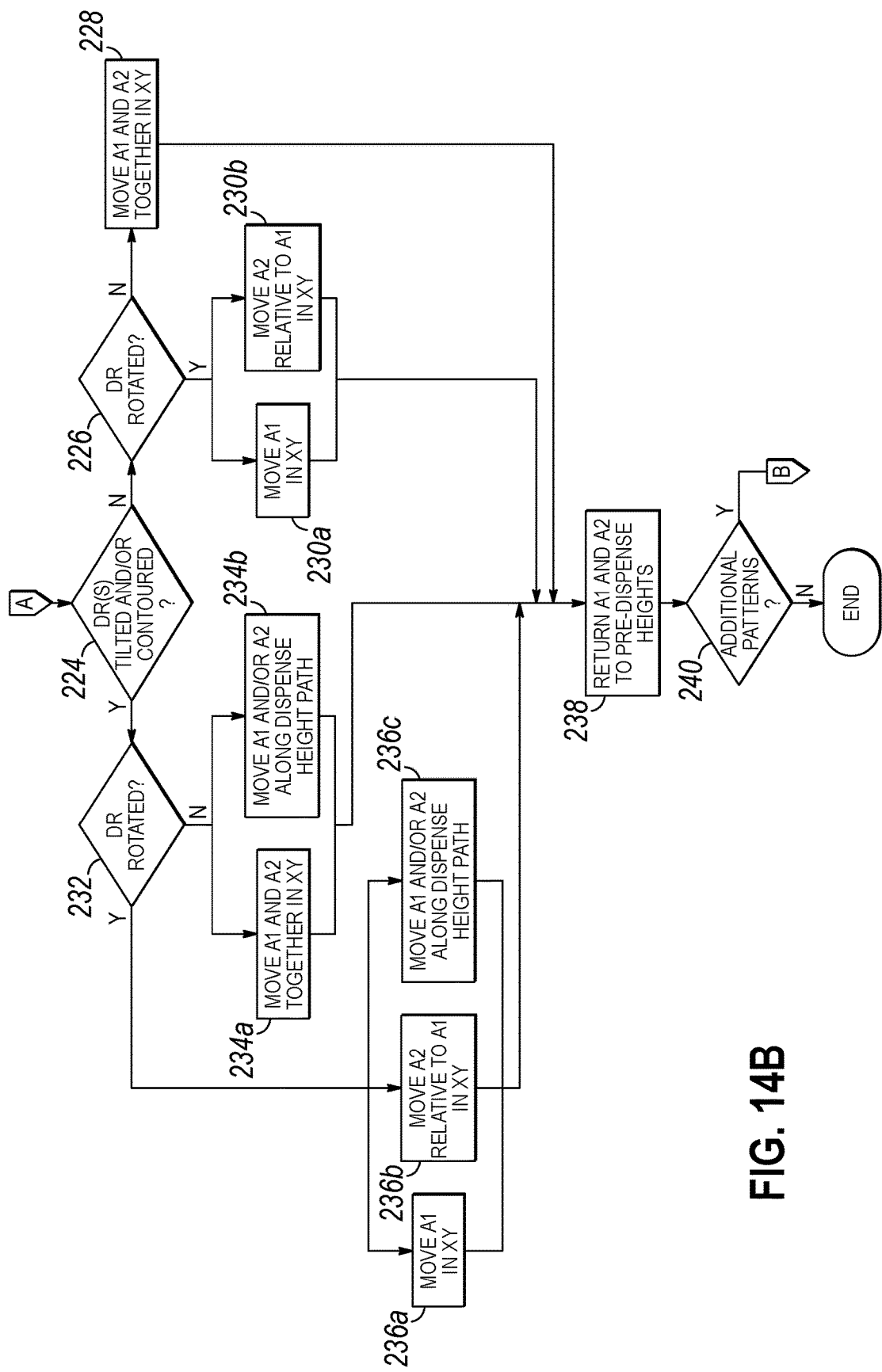

FIGS. 14A and 14B present a flow diagram illustrating steps of a method 200 according to one embodiment of the invention for simultaneously dispensing at first and second dispense regions in a manner consistent with the disclosure above. The method 200 may be performed with dispensing system 30 or any suitable variation thereof, for example. The referenced dispense regions are denoted "DR." As described above, the first and second dispense regions may be first and second substrates, or they may be distinct first and second regions of a single substrate, such as a panelized circuit board. The referenced first and second applicators are denoted "A1" and "A2," and may be mounted to and movable by primary and secondary positioners, respectively, such as positioners 36 and 40 of dispensing system 30 disclosed above.

At step 202, the dispensing system first identifies reference fiducials associated with each of the plurality of dispense regions, for example in the manner described above. In one embodiment, each dispense region may be provided with its own set of corresponding reference fiducials. In another embodiment, multiple dispense regions may be associated with a single set of reference fiducials, for example where the dispense regions are regions of a single substrate. At step 204, the system then determines the location and orientation (i.e., the position) of each dispense location in the XY plane defined by the system, based on the identified reference fiducials. At step 206, the system then collects Z height measurements for the dispense regions through height sensing. As described above, such height sensing may include collecting multiple height measurements for dispense regions that are tilted and/or contoured relative to the XY plane. For example, such height sensing may include collecting multiple height measurements of a path along which fluid is to be dispensed, the path encompassed by a dispense region. Alternatively, as described above, the system may consult surface contour data entered by a user for providing the Z heights.

At step 208, the system may select first and second dispense regions from the plurality of dispense regions, and assign a first applicator A1 for dispensing a first fluid pattern at the first dispense region and a second applicator A2 for dispensing a second fluid pattern at the second dispense region. At step 210, the system then assesses, for each of the selected first and second dispense regions, whether the dispense region is tilted and/or contoured relative to the XY plane, along the Z axis. If the dispense region is not tilted or contoured, the system may proceed to step 212 and determine a proper dispense height for the applicator assigned to the dispense region, based on a single Z height previously measured for the dispense region, as described above. Alternatively, at step 214, where the dispense region is tilted and/or contoured relative to the XY plane, the system may determine a corresponding dispense height path based on multiple Z heights that were previously measured for the dispense region or otherwise provided by external data entered by a user, as described above. For example, where each dispense region is uniquely tilted and/or contoured (see FIGS. 13A and 13B), the system may determine a unique dispense height path corresponding to each dispense region. At step 216, the system may then adjust, as appropriate, the control algorithms associated with an applicator assigned to a tilted and/or contoured dispense region to account for tilt and/or contour of the surface that will be dispensed upon. For example, the control algorithms of an applicator assigned to a tilted and/or contoured dispense region may be adjusted so that the applicator selectively dispenses fluid from a proper height or heights dependent on the dispense height path while moving in directions having X and Y components of movement, to dispense a fluid pattern.

At steps 218a and 218b, the system positions the first applicator in the XY plane above a first dispense site at the first dispense region. Simultaneously, the system may move the second applicator relative to the first applicator in the XY plane to position the second applicator above a first dispense site at the second dispense region. At step 220, the system then simultaneously lowers the first and second applicators along the Z axis to their respective dispense heights, as determined above in steps 210-214. If a dispense region is tilted and/or contoured, its applicator may be lowered to an initial dispense height positioned within the dispense height path. At step 222, the first and second applicators are controlled to start dispensing fluid at the respective dispense regions positioned below.

Starting at step 224, the first and second applicators are moved along the X, Y, and/or Z axes to dispense the first and second fluid patterns, respectively, according to whether either of the first and second dispense regions is tilted and/or contoured relative to the XY plane, and/or rotated in the XY plane relative to the other dispense region (i.e., locally rotated). At step 226, if neither dispense region is tilted or contoured and there is no local rotation, the system may proceed to step 228 and move the first and second applicators together in the XY plane to dispense the first and second fluid patterns. For example, such may be accomplished with the primary positioner 36 of dispensing system 30 through $x_1$ and $y_1$ movements. Through step 228, the second applicator need not be moved relative to the first applicator while dispensing, because the dispense regions are neither tilted nor contoured relative to the XY plane, nor rotated relative to each other in the XY plane. In alternative to step 228, if the dispense regions are rotated relative to each other in the XY plane, the system proceeds to steps 230a and 230b. At steps 230a and 230b, the system moves the first applicator in the XY plane, for example with primary positioner 36, to dispense the first fluid pattern at the first dispense region. Simultaneously, the system moves the second applicator relative to the first applicator in the XY plane, for example with secondary positioner 40, to dispense the second fluid pattern at the second dispense region. Thereby, the system may actively correct for local rotation while dispensing.

In an alternative to step 226, if the first dispense region and/or the second dispense region is tilted and/or contoured relative to the XY plane, the system may proceed to step 232. Through step 232, the system moves the first and second applicators according to whether the first and second dispense regions are rotated relative to each other in the XY plane (i.e., locally rotated). If the dispense regions are not locally rotated, the system may proceed to steps 234a and 234b. At steps 234a and 234b, the system may move the first and second applicators together in the XY plane, as indicated in step 234a, for example with primary positioner 36, to dispense the first and second fluid patterns without relative movement between the applicators in XY. Simultaneously, as indicated in step 234b, the system may move the first applicator and/or the second applicator in Z along a corresponding dispense height path (determined in step 214) to account for tilt and/or contour of a corresponding dispense region relative to the XY plane.

In alternative to steps 234a and 234b, if the dispense regions are locally rotated in addition to at least one of them being tilted and/or contoured, the system may proceed to steps 236a, 236b, and 236c. At step 236a, the first applicator is moved in the XY plane, for example with primary positioner 36, to dispense the first fluid pattern at the first dispense region. Simultaneously, at step 236b, the second applicator is moved relative to the first applicator in the XY plane, for example with secondary positioner 40, to dispense the second fluid pattern at the second dispense region. Simultaneously, at step 236c, the first applicator and/or the second applicator is moved in Z along a corresponding dispense height path to account for tilt and/or contour of a corresponding dispense region relative to the XY plane.

At step 238, upon completion of dispensing the first and second fluid patterns, the first and second applicators may be raised back up along the Z axis to their pre-dispense heights, for example. At step 240, the system may evaluate whether there are additional fluid patterns to be dispensed, for example at third and fourth dispense regions. If there remains additional dispensing to be performed, the system may return to step 208, as indicated by symbol B. If all dispensing is complete, the system may end its dispensing operations.

Methods of dispensing have been described above in connection with specified orientations of first and second dispense regions and corresponding movements of first and second applicators for simultaneously dispensing at the first and second dispense regions. However, persons skilled in the art will appreciate that the methods described may be adapted as appropriate to simultaneously dispense at any two dispense regions. For example, where the first dispense region and/or the second dispense region is uniquely tilted and/or contoured relative to the XY plane, the system may move the first applicator and the second applicator independently along X, Y, and/or Z while dispensing to simultaneously dispense a first fluid pattern at the first dispense region and a second fluid pattern at the second dispense region.

While the present invention has been illustrated by the description of specific embodiments thereof, and while the embodiments have been described in considerable detail, it is not intended to restrict or in any way limit the scope of the appended claims to such detail. The various features discussed herein may be used alone or in any combination. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of the general inventive concept.

What is claimed is:

1. A dispensing system for dispensing fluid at a first dispense region and a second dispense region, the first dispense region and the second dispense region being on one or more electronic substrates, the first dispense region and the second dispense region being positioned relative to a reference plane defined by a first axis and a second axis orthogonal to the first axis, the dispensing system comprising:
    a first non-contact applicator supported by a primary positioner, the first applicator having a first tip configured to dispense a first fluid pattern at the first dispense region;
    a second non-contact applicator supported by a secondary positioner, the second applicator having a second tip configured to dispense a second fluid pattern at the second dispense region;
    the primary positioner configured to position the first applicator for dispensing fluid at the first dispense region, the primary positioner supporting the first applicator and having a first drive to move the first applicator in a direction parallel to the first axis, a second drive to move the first applicator in a direction parallel to the second axis, and a third drive to move the first applicator in a direction parallel to a third axis, the third axis being mutually orthogonal with the first axis and the second axis; and
    the secondary positioner configured to position the second applicator for dispensing the second fluid pattern at the second dispense region, the secondary positioner supporting the second applicator and having a first drive configured to move the second applicator independent of the first applicator in a direction parallel to the first axis, a second drive configured to move the second applicator relative to the first applicator in a direction parallel to the second axis, and a third drive configured to move the second applicator independent of the first applicator in a direction parallel to the third axis after the second applicator has started dispensing the second fluid pattern and before the second applicator has completed dispensing the second fluid pattern.

2. The dispensing system of claim 1, wherein the secondary positioner is automatically movable with its corresponding drives relative to the primary positioner while the first applicator dispenses fluid at the first dispense region and the second applicator simultaneously dispenses fluid at the second dispense region.

3. The dispensing system of claim 1, wherein a tip of the second applicator does not contact the second dispense region.

4. The dispensing system of claim 1, wherein the primary positioner is movable with a first range of motion in a direction parallel to the first axis, a second range of motion in a direction parallel to the second axis, and a third range of motion in a direction parallel to the third axis, and the secondary positioner is movable with a first range of motion in a direction parallel to the first axis, a second range of motion in a direction parallel to the second axis, and a third range of motion in a direction parallel to the third axis, and
    wherein the second range of motion of the secondary positioner is less than the corresponding second range of motion of the primary positioner.

5. The dispensing system of claim 1, wherein each of the first drives, each of the second drives, and each of the third drives includes an electrical motor.

6. The dispensing system of claim 1, further comprising:
    at least one controller for commanding movement of the primary positioner relative to the first axis, the second axis, and the third axis, and movement of the secondary positioner relative to the first axis, the second axis, and the third axis.

7. The dispensing system of claim 6, wherein:
    the first applicator is automatically movable by the primary positioner, under control of the controller, in a direction parallel to the first axis, a direction parallel to the second axis, and a direction parallel to the third axis, while dispensing fluid at the first dispense region, and
    the second applicator is automatically movable by the secondary positioner, under control of the controller, in a direction parallel to the first axis, a direction parallel to the second axis, and a direction parallel to the third axis, while dispensing fluid at the second dispense region,
    the first applicator and the second applicator being automatically movable to account for misalignment with at least one of the first dispense region or the second dispense region with at least one of the first axis, the second axis, or the third axis.

8. The dispensing system of claim 6, wherein the controller controls the first drive, the second drive, and the third drive of the primary positioner, and the first drive, the second drive, and the third drive of the secondary positioner.

9. The dispensing system of claim 6, further comprising a height sensor configured to detect a dispense gap between the second tip and the second dispense region.

10. The dispensing system of claim 9, wherein the second applicator is configured to maintain a constant dispense gap between the second tip and the second dispense region while moving in the direction along the third axis.

11. The dispensing system of claim 1, wherein at least one of the first dispense region and the second dispense region is at least partially tilted or contoured relative to the reference plane along the third axis.

12. The dispensing system of claim 1, wherein the first dispense region includes an electronic first substrate, and the second dispense region includes an electronic second substrate.

13. The dispensing system of claim 1, wherein the second drive is configured to move the second applicator independent of the first applicator in a direction parallel to the second axis.

14. The dispensing system of claim 1, wherein the secondary positioner is coupled to the primary positioner.

15. The dispensing system of claim 1, wherein the first applicator and the second applicator are configured to be moved independently in the first axis, the second axis, and the third axis while the first applicator is dispensing the first fluid pattern at the first dispense region and the second applicator is simultaneously dispensing the second fluid pattern at the second dispense region.

16. The dispensing system of claim 4, wherein the first range of motion and the third range of motion of the secondary positioner are less than the corresponding first range of motion and third range of motion of the primary positioner.

17. The dispensing system of claim 6, wherein:
the first dispense region is provided at a first position along the third axis and the second dispense region is provided at a second position along the third axis that is different from the first position, and
the controller is further configured to control the primary positioner to move the first applicator in a direction parallel to the third axis toward a first dispense height based on the first position, and simultaneously control the secondary positioner to move the second applicator relative to the first applicator in a direction parallel to the third axis toward a second dispense height based on the second position.

18. The dispensing system of claim 1, wherein:
the first non-contact applicator is configured to dispense the first fluid pattern at the first dispense region without the first tip contacting the first dispense region, and
the second non-contact applicator is configured to dispense the second fluid pattern at the second dispense region without the second tip contacting the second dispense region.

* * * * *